（12）United States Patent
Troccoli et al.

(10) Patent No.: US 9,946,915 B1
(45) Date of Patent: Apr. 17, 2018

(54) FINGERPRINT SENSORS WITH ESD PROTECTION

(71) Applicant: NEXT BIOMETRICS GROUP ASA, Oslo (NO)

(72) Inventors: Matias N. Troccoli, Kirkland, WA (US); Huiqing Pang, Kirkland, WA (US); King Hong Kwan, Bellevue, WA (US); Jamie Lyn Shaffer, Bothell, WA (US)

(73) Assignee: NEXT BIOMETRICS GROUP ASA, Oslo (NO)

( * ) Notice: Subject to any disclaimer, the term of this patent is extended or adjusted under 35 U.S.C. 154(b) by 0 days.

(21) Appl. No.: 15/422,070

(22) Filed: Feb. 1, 2017

Related U.S. Application Data

(60) Provisional application No. 62/408,177, filed on Oct. 14, 2016.

(51) Int. Cl.
*G06K 9/00* (2006.01)
*H01L 27/02* (2006.01)

(52) U.S. Cl.
CPC ....... *G06K 9/00053* (2013.01); *G06K 9/0002* (2013.01); *G06K 9/00087* (2013.01); *H01L 27/0255* (2013.01)

(58) Field of Classification Search
USPC .......................................................... 382/124
See application file for complete search history.

(56) References Cited

U.S. PATENT DOCUMENTS

| | | | |
|---|---|---|---|
| 6,091,837 A | 7/2000 | Dinh | |
| 6,515,488 B1 | 2/2003 | Thomas | |
| 6,900,644 B2 | 5/2005 | Chou et al. | |
| 7,076,089 B2 | 7/2006 | Brandt et al. | |
| 7,397,096 B2 | 7/2008 | Chou et al. | |
| 7,768,273 B1 | 8/2010 | Kalnitsky et al. | |
| 7,910,902 B2 | 3/2011 | Dinh | |

(Continued)

FOREIGN PATENT DOCUMENTS

| | | |
|---|---|---|
| CN | 104077572 A | 10/2014 |
| CN | 104103621 A | 10/2014 |

(Continued)

OTHER PUBLICATIONS

PCT International Search Report and Written Opinion dated May 8, 2017 in corresponding PCT International Application No. PCT/IB2017/000168, pp. 1-10.

*Primary Examiner* — Jerome Grant, II
(74) *Attorney, Agent, or Firm* — Duane Moris LLP

(57) ABSTRACT

A fingerprint sensing device includes a substrate; a plurality of pixels arranged in a grid of rows and columns, each pixel having an active thermal sensing element therein; a first metal layer forming first addressing lines for addressing the active thermal sensing elements; a second metal layer above the first metal layer and forming second addressing lines for addressing the active thermal sensing elements; an electrically conductive ESD protection layer; and an insulating layer disposed between the ESD protection layer and the active thermal sensing elements. The ESD protection layer is electrically connected to a bias potential. The ESD protection layer is disposed in a pattern such that it partially overlaps each pixel, the ESD protection layer at least partially overlapping the active thermal sensing element of each pixel.

32 Claims, 31 Drawing Sheets

(56) References Cited

U.S. PATENT DOCUMENTS

| | | |
|---|---|---|
| 8,085,998 B2 | 12/2011 | Setlak et al. |
| 8,736,001 B2 | 5/2014 | Salatino et al. |
| 9,025,301 B1 | 5/2015 | Adlam |
| 9,465,973 B1 | 10/2016 | Lin et al. |
| 2004/0136127 A1* | 7/2004 | Kodama .............. H01L 27/0262 361/56 |
| 2006/0033162 A1* | 2/2006 | Sang ................... H01L 27/0266 257/355 |
| 2006/0217915 A1 | 9/2006 | Dinh |
| 2007/0098228 A1 | 5/2007 | Perreault |
| 2010/0290166 A1 | 11/2010 | Lin et al. |
| 2011/0100727 A1* | 5/2011 | Choi ..................... G06F 3/0418 178/18.01 |
| 2011/0182488 A1* | 7/2011 | Bredholt .............. G06K 9/0002 382/124 |
| 2013/0113711 A1 | 5/2013 | Nien et al. |
| 2013/0181949 A1 | 7/2013 | Setlak |
| 2016/0154989 A1 | 6/2016 | Lin |
| 2016/0171272 A1 | 6/2016 | Yang |
| 2016/0171276 A1* | 6/2016 | Chiang .............. G06K 9/00053 382/124 |
| 2016/0321442 A1 | 11/2016 | Song et al. |
| 2016/0354801 A1 | 12/2016 | Lundahl |
| 2016/0371528 A1 | 12/2016 | Slaby et al. |
| 2016/0381775 A1 | 12/2016 | Wang |
| 2016/0381787 A1 | 12/2016 | Chen |
| 2017/0135188 A1* | 5/2017 | Heidebrecht ............. H05F 3/02 |
| 2017/0200769 A1* | 7/2017 | Bertin .................. H01L 27/285 |
| 2017/0255741 A1* | 9/2017 | Sharma ............... G06F 17/5081 |
| 2017/0286744 A1* | 10/2017 | Chiang ................ G06K 9/0002 |
| 2017/0330017 A1* | 11/2017 | Chen .................. G06K 9/00013 |

FOREIGN PATENT DOCUMENTS

| | | |
|---|---|---|
| CN | 203930876 U | 11/2014 |
| CN | 104282631 A | 1/2015 |
| CN | 205302324 U | 6/2016 |
| CN | 106156710 A | 11/2016 |
| CN | 106156746 A | 11/2016 |
| KR | 101602842 B1 | 3/2016 |
| WO | 2016118683 A1 | 7/2016 |

\* cited by examiner

FINGERPRINT SENSORS WITH ESD PROTECTION

CROSS REFERENCE TO RELATED APPLICATIONS

This application claims priority to U.S. Provisional Patent Application Ser. No. 62/408,177 filed Oct. 14, 2016, the entirety of which is incorporated herein by reference.

TECHNICAL FIELD

The present invention relates to fingerprint sensors, and more particularly to electrostatic discharge (ESD) protection for fingerprint sensors.

BACKGROUND

Fingerprint sensors employing the so-called "active thermal principle" are disclosed in U.S. Pat. Nos. 6,091,837 and 7,910,902, both to Ngoc Minh Dinh. The basic principle of the active thermal fingerprint sensor is the use of an array of PIN diodes as thermal sensors to differentiate the ridges and valleys of the human fingerprint since the heat transfer in these two areas are different. (A PIN diode is a diode with a wide, undoped intrinsic semiconductor region between a p-type semiconductor and an n-type semiconductor region. The p-type and n-type regions are typically heavily doped to form ohmic contacts). To maximize sensitivity, the spacing between the finger and the active sensor array must be as small as possible, typically less than 3 µm. This close proximity means that the fingerprint sensor is prone to various levels of ESD voltage and the ESD will have a high concentration over a smaller area. This environment presents a unique challenge for optimizing among ESD protection, mechanical stress tolerance, and thermal signal sensitivity.

Adding ESD diodes and adding ESD protection circuitry are conventional methods used to address ESD issues. Touch panels, for example, address ESD with circuitry composed of diodes or transistors or the combination thereof added to corresponding rows and/or columns, as described in U.S. Patent Application Publication No. 2013/0113711 to Nien et al. Additional metal bars may be placed around the touch panel to provide a low impedance path to redirect the electrostatic charge to the ESD diodes, as disclosed in U.S. Patent Application Publication No. 2010/0290166 to Lin et al. For other fingerprint sensing applications, various options have been proposed to tackle this challenge. U.S. Pat. No. 6,900,644 to Chou et al., U.S. Pat. No. 7,076,089 to Brandt et al., and U.S. Pat. No. 7,768,273 to Kalnitsky et al. all demonstrate a similar approach, which is distributing an ESD protection layer in the form of individual conductive plates next to the electrode in a capacitive fingerprint sensor. However, these ESD mitigation options often run into a fundamental limitation of the capacitive fingerprint sensor: tradeoff between ESD protection effectiveness and sensing resolution. Due to the operating mechanism of a capacitive fingerprint sensor, there has to be a certain distance between the ESD units and the active electrode when in the same plane, and they cannot be overlapped if in different planes, otherwise image quality may be deteriorated and resolution may be reduced. Thus, the amount of these ESD units are typically limited to less than 10% of the active electrode, which limits the ESD protection effectiveness. In U.S. Pat. No. 7,397,096 to Chou et al., an external ESD protection layer is deposited on top of the peripheral circuits to redirect the electrostatic charge to ground. However this scheme is only effective if the finger touches the peripheral area. That is, it offers no ESD protection over the active area which is the primary concern.

SUMMARY OF THE INVENTION

In embodiments, a fingerprint sensing device includes a substrate; a plurality of pixels arranged in a grid of rows and columns, each pixel having an active thermal sensing element therein; a first metal layer forming first addressing lines for addressing the active thermal sensing elements; a second metal layer above the first metal layer and forming second addressing lines for addressing the active thermal sensing elements; an electrically conductive ESD protection layer; and an insulating layer disposed between the ESD protection layer and the active thermal sensing elements. The ESD protection layer is electrically connected to a bias potential. The ESD protection layer is disposed in a pattern such that it partially overlaps each pixel, the ESD protection layer at least partially overlapping the active thermal sensing element of each pixel.

In embodiments of a fingerprint sensing device, the fingerprint sensing device includes a substrate; a plurality of pixels arranged in a grid of rows and columns, each pixel having an active thermal sensing element therein; a first metal layer forming first addressing lines for addressing the active thermal sensing elements; a second metal layer forming second addressing lines for addressing the active thermal sensing elements; a first electrically conductive ESD protection layer; a second electrically conductive ESD protection layer disposed at a layer above the first ESD protection layer; and an insulating layer disposed between the first and second ESD protection layers, wherein at least one of the first and second ESD protection layers is connected to a bias potential.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
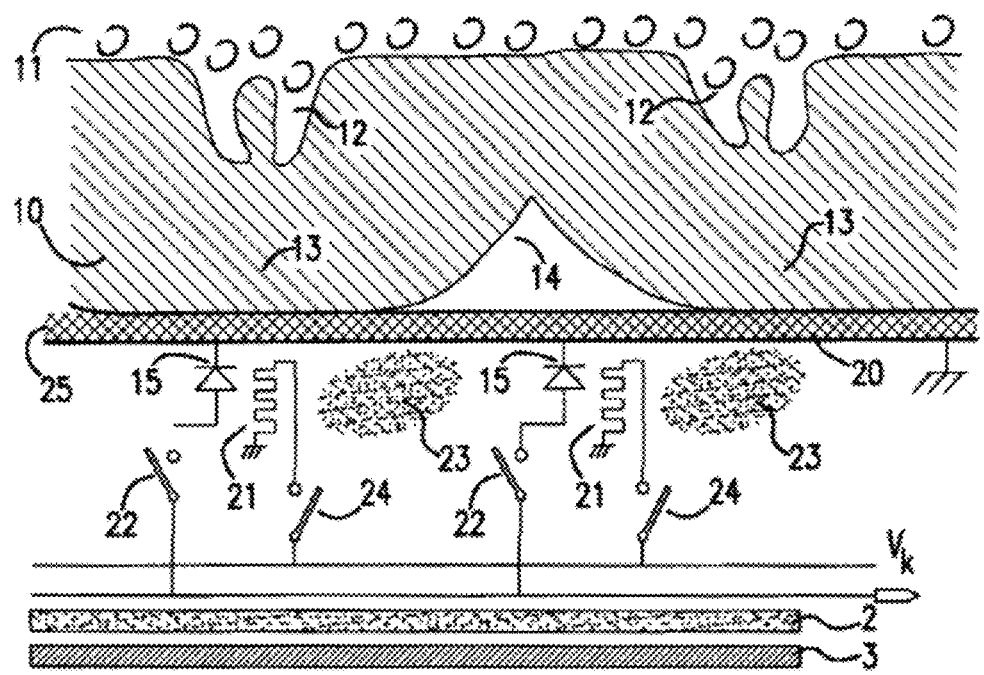
FIG. 1 shows a schematic sketch of a prior art layout of a sensor operating under the active thermal principle.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation, nor to be in contact with each other unless specified. Terms such as "overlap" refers to graphically cover, but not necessarily in contact with each other. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical "connections" and "coupling" refer to a relationship wherein components communicate with one another electrically either directly or indirectly through intervening structures unless described otherwise.

In embodiments disclosed herein an ESD protection scheme is designed for fingerprint sensors employing the active thermal principle, as described in, for example, U.S. Pat. No. 6,091,837 and U.S. Pat. No. 7,910,902, both to Ngoc Minh Dinh, the entirety of which are hereby incorporated by reference herein. As described above, sensors of this type are particularly vulnerable to the electrostatic charge released during each finger touch. The high energy ESD charge can create irreversible damage to the physical structures and the properties of the sensor circuitry. The sensor design presents a unique challenge for optimizing among ESD protection, mechanical stress tolerance, and thermal signal sensitivity. In embodiments described herein, a design scheme is provided that is optimized in these three areas.

In contrast to the conventional method from other related arts where ESD diodes or circuitry are added, one advantage of sensors operating on the active thermal principle is that the ESD protection layer can be strategically disposed directly over the active sensing elements. In disclosed embodiments of the ESD protection scheme, one or more electrically conductive ESD protection layers are disposed directly over each pixel, especially the active thermal sensing element, without requiring any additional circuitry. In this regard, the ESD protection layers are passive yet effective. The protection layers not only minimize the ESD damage but also provide better planarization and enhance mechanical stress tolerances with little or no loss of thermal signal and sensitivity.

In embodiments, the ESD protection layer can be grounded or can be connected to a bias potential. The active sensing element herein is the PIN diode or more specifically the intrinsic region of the PIN diode that detects the thermal signal. Unlike the capacitive counterpart, a properly designed conductive ESD protection layer disposed directly over the sensing element can have little or no loss of thermal signal strength between the sensing element and the fingerprint. The sensing resolution and the ESD robustness are not compromised. In embodiments, the ESD protection layer can be further patterned in such a way to enhance the mechanical robustness of the device by planarizing the device's surface profile. In other embodiments, two different ESD protection layers may be disposed with an insulator in between. These ESD protection layers can be electrically connected through vias for performance optimization.

In embodiments, ion-implanted regions are strategically placed inside each pixel or at specific locations of the sensor to serve as a local recombination reservoir for the ESD charge. The electrostatic charge is composed of highly concentrated electrons (negatively charged) or holes (positively charged). The electrostatic charge has an intense attraction to the particles of the opposite charge. When in close proximity, if an object is saturated with the charges of the opposite polarity, the electrostatic charge will race toward the object over the air or other dielectric material resulting in a localized electron-hole recombination. In embodiments, the object is equivalent to an ion-implanted semiconductor region neighboring the PIN diode within each pixel. In embodiments, these local reservoirs are shorted to the ESD ground but electrically isolated from the PIN diode, and they are used for attracting and dissipating the ESD charge locally. The ESD charge can either be redirected to the system ground through the low impedance ESD protection layer or dissipated locally by the opposite charges in the implantation areas.

In embodiments, the ESD protection scheme includes a first ESD protection layer that is electrically grounded, and a second ESD protection layer that is electrically connected to the first ESD protection layer through vias. In particular, at least one of the two ESD protection layers is deposited over the active sensing element which provides the essential fingerprint sensing function. For example, in a capacitive fingerprint sensor, an active sensing element refers to the electrodes that serve as capacitive sensors. But in embodiments disclosed herein the active sensing element refers to the PIN diode or more preferably the intrinsic region of the PIN diode where the thermal signal is detected. An insulating layer is deposited between the two ESD protection layers. The first ESD protection layer may be deposited in the same deposition step during the active area patterning. The two ESD protection layers may have different sheet resistances. Alternatively, the two ESD protection layers may have the same sheet resistance. Additional hard coat layers may be deposited over the ESD protection layer for further mechanical protection. The ESD protection layers may be patterned such that a planarization effect may be achieved and thus improved mechanical properties. In another embodiment, only one ESD protection layer is deposited and is electrically connected to ground. The pattern of the ESD protection layers may be further designed to enhance the thermal signal. The materials of the ESD protection layer should be carefully selected to balance electrical conductivity, thermal conductivity, hardness, design compatibility and fabrication cost, as well as the esthetic effect. Examples of materials used for the first and second ESD protection layers include but are not limited to indium tin oxide (ITO), indium zinc oxide (IZO), Molybdenum, Aluminum, Aluminum nitride, Ti, Ag, Ag nanowires, Ag nano particles, carbon nanotubes (CNTs) or the combination thereof. In another embodiment, additional ion-implanted regions may be distributed inside each sensing pixel. These regions serve as additional electron-hole recombination reservoirs to locally neutralize ESD charge and to minimize the overall ESD damage.

FIG. 1 corresponds to FIG. 4 of U.S. Pat. No. 6,091,837 and shows a schematic sketch of a layout of the electronic circuits of an active thermal principle sensor. The figure shows details of the contact surface between the sensor and the fingerprint in which the sensor is heated by means of a uniform heat supply. The fingerprint comprises ridges 13 with valleys 14 between them. The skin is comprised by an outer skin 10 (epidermis) with an area 11 behind it with circulation of blood (indicated by circular arrows). Underneath the ridges 13 there are papilla 12 which, among other things, have blood circulation. The ridges 13 come in contact with the sensor and are heated, and the blood circulation in the finger transports the heat away. In the valleys the surface of the sensor is cooled essentially by two mechanisms, radiation and heat conduction in the air comprised in the valley 14. These cooling mechanisms are not as efficient as the heat conduction in the ridges 13, which results in a difference between the relative temperature measured in the ridges 13 and the relative temperature which is not. These temperatures may be measured using the temperature sensors 15. Measurements from all the temperature sensors 15 are collected and, using information regarding supplied energy, a pattern is made showing the fingerprint.

The temperature at the temperature sensors 15 may be measured at one or more points of time, or continuously. Using a plurality of, or continuous, measurements a picture may be obtained showing the effective heat capacity at the different measuring points, in addition to the heat conductivity. The sweat ducts and the surrounding skin cells, which have a high heat capacity due to a high content of water, are located in the ridges of a fingerprint. As such, the difference in heat capacity enhances the ability of the sensor to distinguish the ridges from the valleys.

Closest to the fingerprint is located an electrically conducting, earthed layer 20 made for example from aluminum or other conducting or semiconducting material, to avoid electric disturbances from the surroundings and to prevent discharges from harming the sensor. This layer 20 may also comprise a layer made from a mechanically resistant material 25, e.g. $SiO_2$, $Si_3N_4$ or $\alpha$-$Al_2O_3$, to protect the sensor from mechanical stress and chemical corrosion. These layers 20, 25 should preferably be sufficiently thin as not to hinder the heat transportation to the fingerprint and affect the measurements.

Between the sensor elements 15 there is an insulating area 23 limiting the heat conduction between the elements. In practice the sensor elements 15 will be surrounded by insulating areas in order to thermally insulate them from each other. The insulating area 23 may for example be made from $SiO_2$ or similar materials. The insulating material may be the same as, or compatible with, and is connected to, a thermal insulating layer 2.

Each sensor element 15 has a corresponding heating element 21 producing a known amount of heat. In the shown example the heating elements 21 are controlled centrally by $V_k$ and by using an electronic contact switch 24. It is, however, possible to provide the circuit with a separate control of each heating element to give a local control of the heat supply. The signal from the temperature sensor is addressed and controlled using an electronic contact switch 22, e.g. a double gate MosFET transistor.

As can be seen from FIG. 1, the earthed layer 20 is deposited across the entire sensor surface, coving sensor elements 15, insulating area 23 and heating element 21. Although this provides protection over electric disturbances and discharges, it reduces mechanical robustness of the sensor. Embodiments described herein address this challenge.

Figure 2:
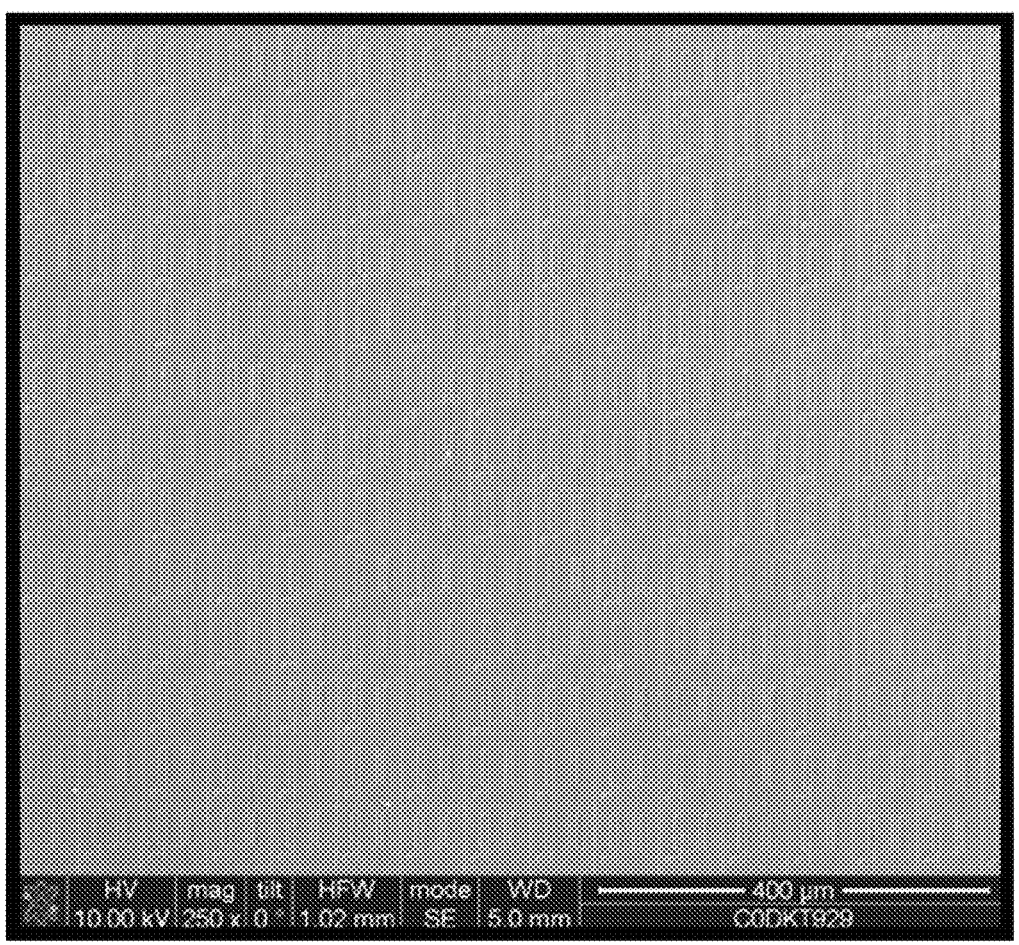
FIG. 2 shows an SEM image of the active sensor area of an array of PIN diodes.
Figure 2A:
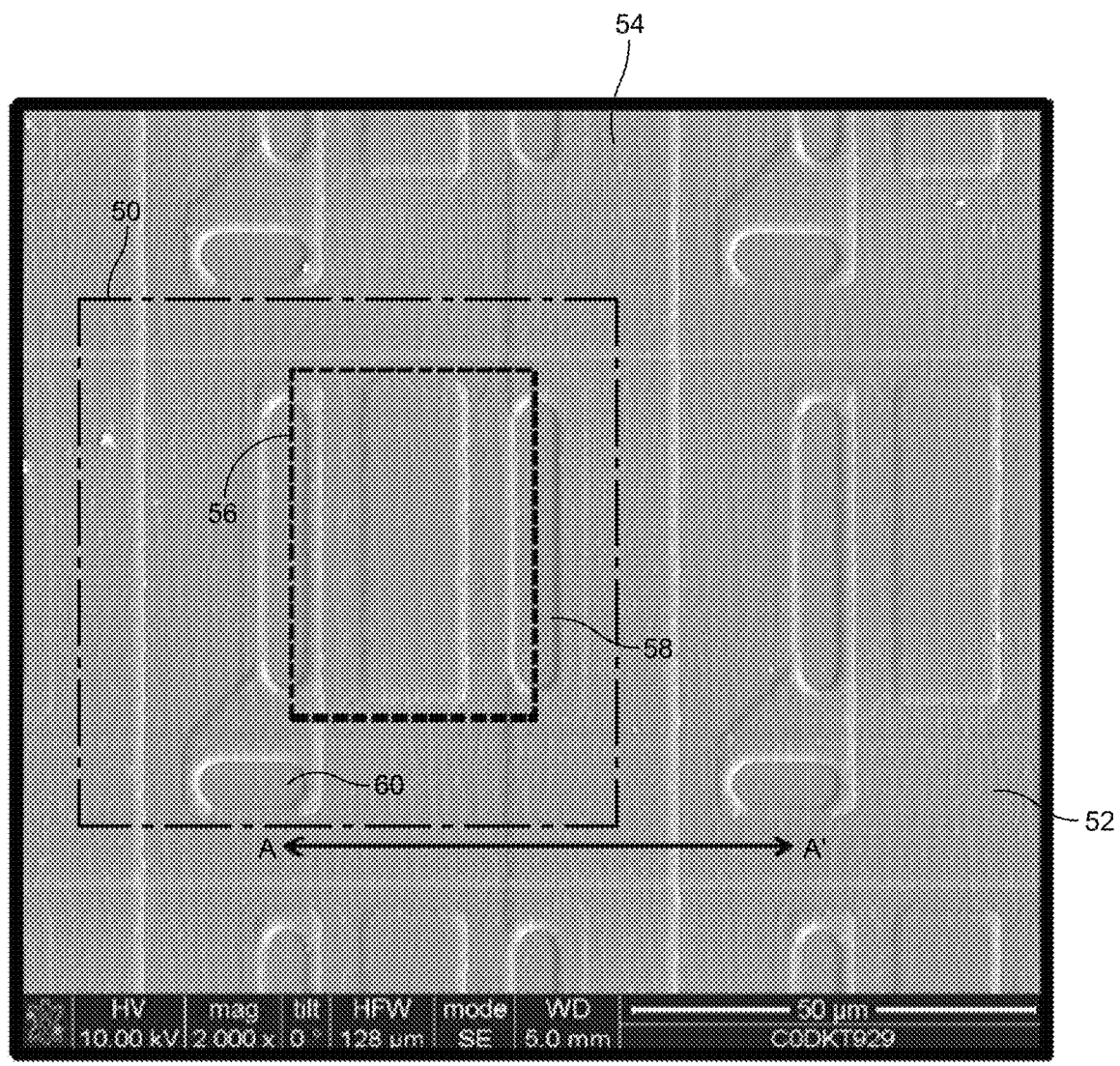
FIG. 2A shows a zoomed-in image of an individual pixel.
Figure 3:
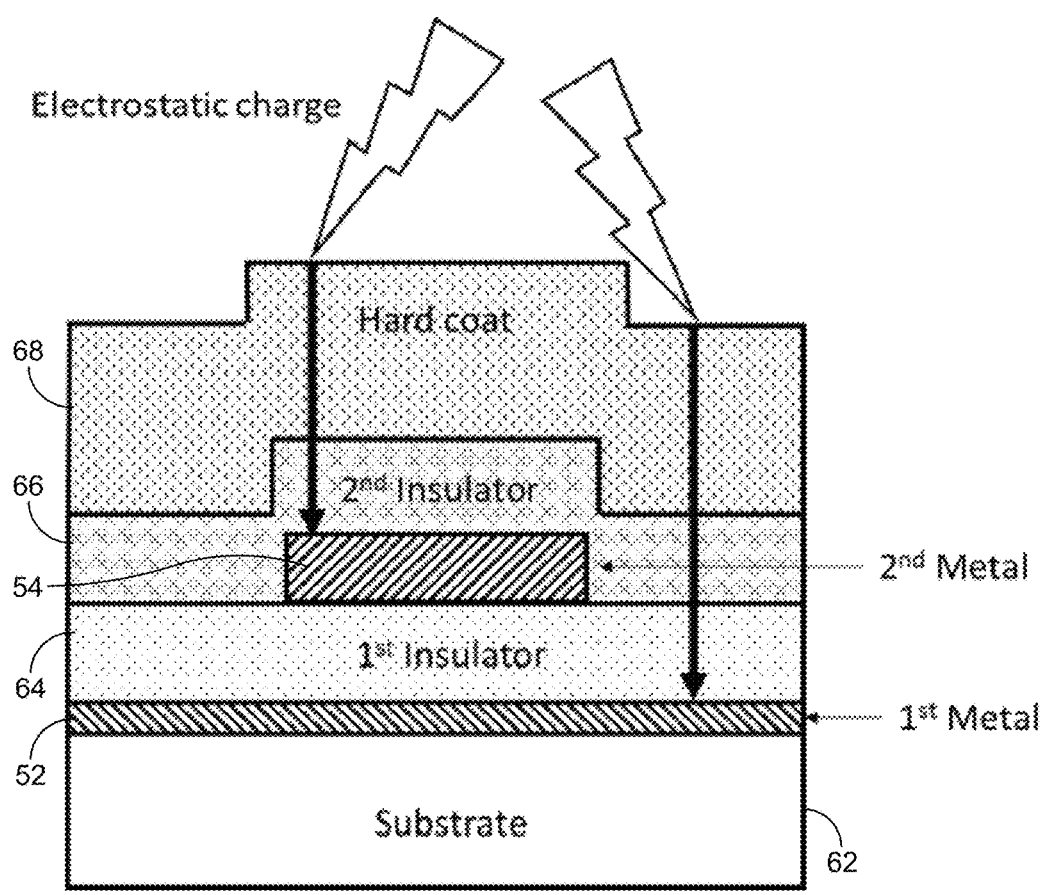
FIG. 3 is a cross-sectional view of a pixel structure taken along line A-A' of FIG. 2A.

While one form of active thermal principle sensor is described above in connection with prior art FIG. 1, it should be understood that the ESD protection techniques described herein apply to other forms of active thermal principle sensors and layouts. In exemplary embodiments, the active thermal fingerprint sensor includes an array of PIN diodes. The PIN diodes are addressed by row and column decoding circuits. FIG. 2 shows an SEM image of the active area of an active thermal fingerprint sensor where an array of PIN diodes are connected to row and column addressing lines, and FIG. 2A shows a zoomed-in image of an individual pixel 50. Each PIN diode 56 is connected to a column metal line 52 at a well 60 and a row metal line 54 at a well 58. Of course, the orientations of the column and row lines may be reversed. A cross-section view along line AA' is illustrated in FIG. 3.

To form such a pixel structure 50, a substrate 62 is provided, and a first metal layer 52 is disposed over the substrate to serve as a first (e.g., column) addressing line. Then a first insulating layer 64 is disposed over the first metal layer 52, followed by a second metal layer 54 to serve as a second (e.g., row) addressing line. Finally, a second insulating layer 66 is disposed over the second metal layer 54. There may be other buffer layer(s) disposed prior to the first metal layer 52 for insulation and planarization purpose. In embodiments, Low-Temperature-Polycrystalline-Silicon (LTPS) technology is used to construct the active devices such as diodes and any thin film transistors (TFTs). Details of LTPS processes are known to those skilled in the art, and are not repeated herein so as to avoid unnecessarily obscuring the present disclosure. In embodiments, the substrate can be a rigid material such as glass, or a flexible material such as but not limited to, polyethylene terephthalate (PET), polyethylene naphthalate (PEN), polyimide, metal foil, and flexible glass, etc. In embodiments, an additional hard coat layer 68 (or layers) may be deposited over the second insulating layer 66 to provide further mechanical protection.

Figure 4A:
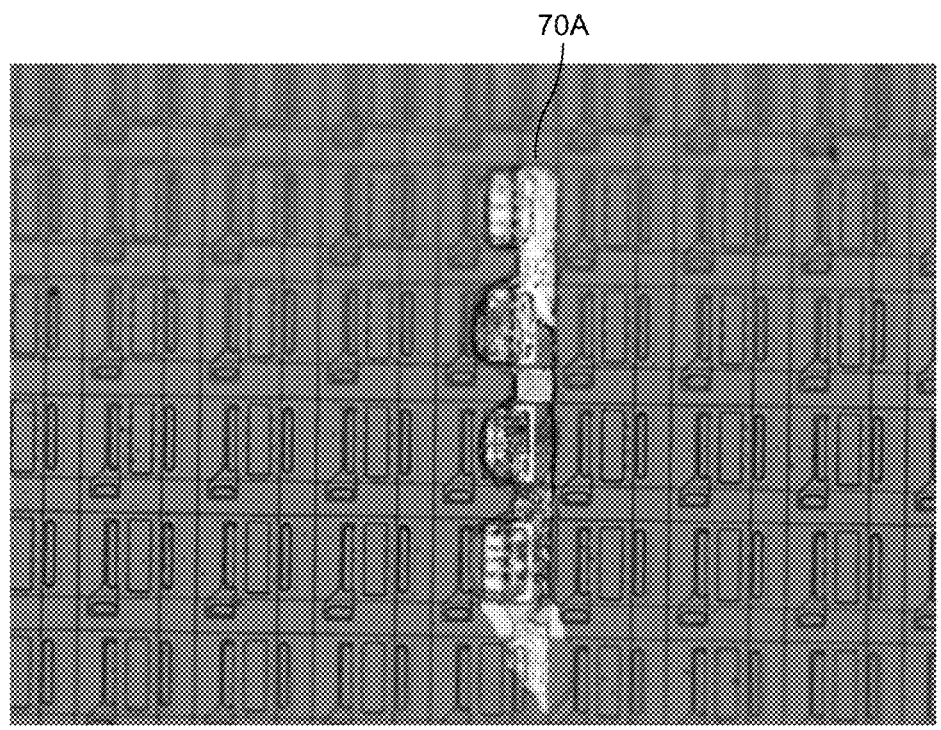
FIGS. 4A and 4B are microscopic images of damaged metal lines and pixels caused by ESD charge.
Figure 4B:
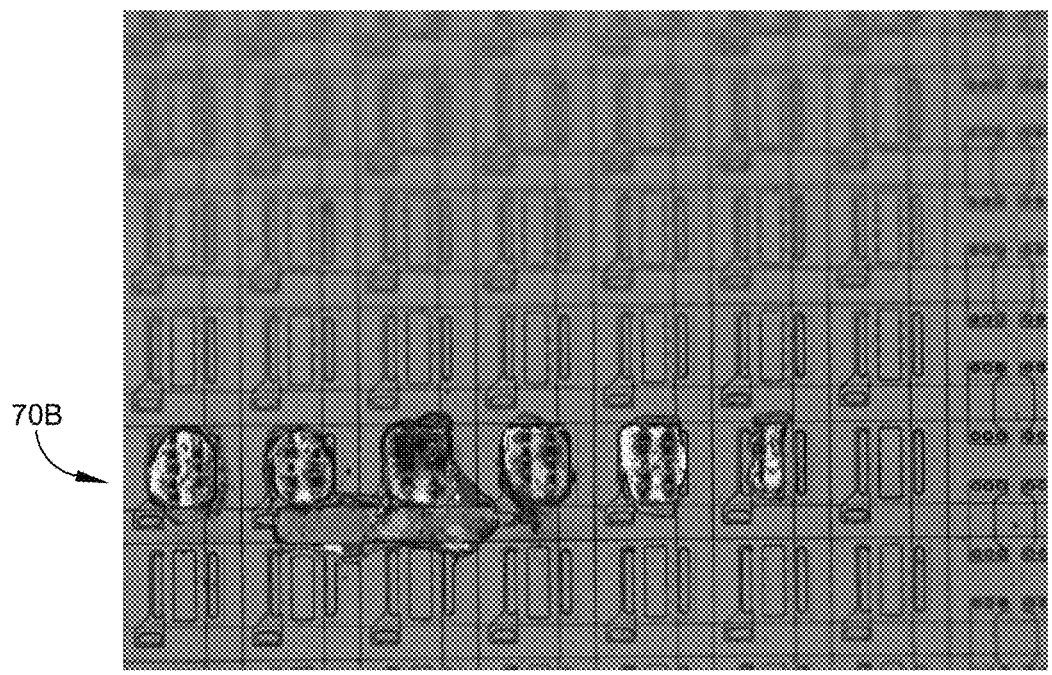
Figure 5:
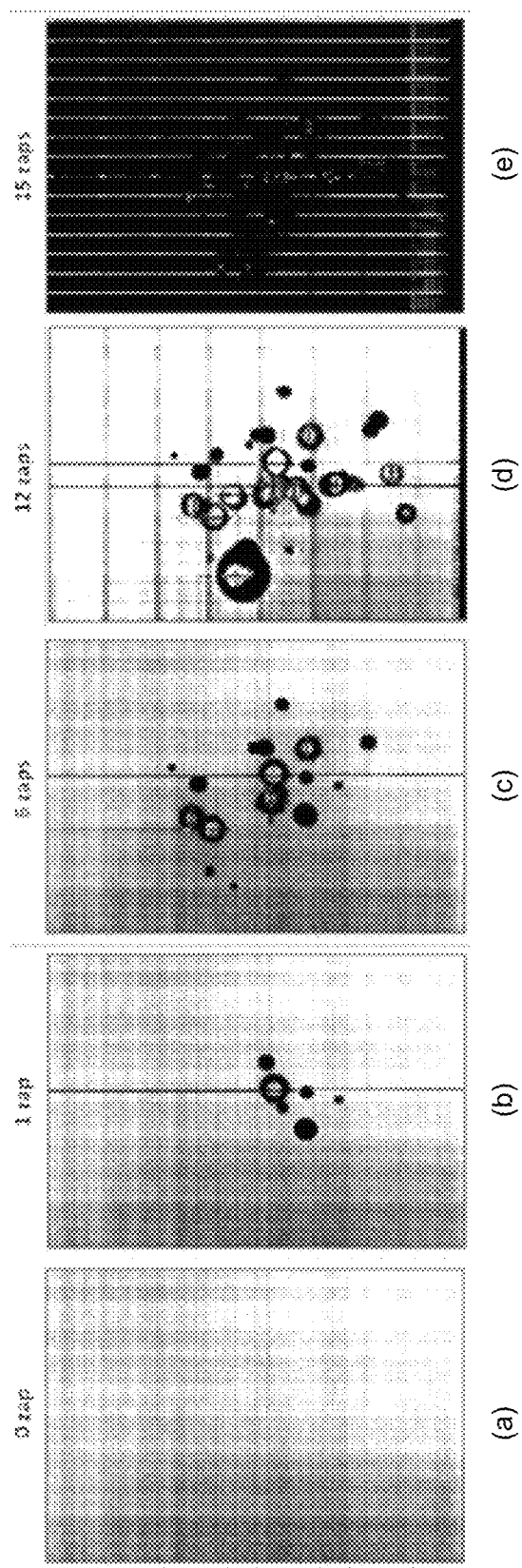
FIG. 5 shows an example of the image captured with a fingerprint sensor before and after ESD shock.

When a human finger approaches the surface of the sensor, electrostatic charge carried by the person may be strong enough to cause an ESD event. When this occurs, an electrical path may be generated penetrating through the hard coat layer 68 and/or insulating layers 64, 66 to the conductive layers 52, 54 underneath. This usually causes irreversible damage to the metal layers 52, 54 and the pixel sensing circuit (i.e., PIN didoes), as shown in FIGS. 4A and 4B, which show microscopic images of damaged metal lines and pixels (referenced by references 70A, 70B, respectively) caused by ESD charge. Consequently, dead pixels, dead lines, or catastrophic failure may occur in the sensor. FIG. 5 shows an example of the image captured with the fingerprint sensor before and after ESD shock at 15 KV for up to 15 times. ESD shock was simulated by zapping the device with an ESD gun. The sensor completely failed to function after 15 zaps at 15 KV.

In addition to ESD tolerance, the fingerprint sensor must exhibit sufficient mechanical strength against the pen drop test, scratch test, and wear test. Experiments confirm that a planarized surface uniformly distributes the mechanical stress over a larger area, increasing the overall tolerance to scratches and wear. In addition, the planarization protects the sharp edges of the surface topology which typically are mechanically weak points. Therefore, in embodiments, the layout of the ESD protection layer is specifically designed to optimize for both ESD performance and planarization effect.

Figure 6A:
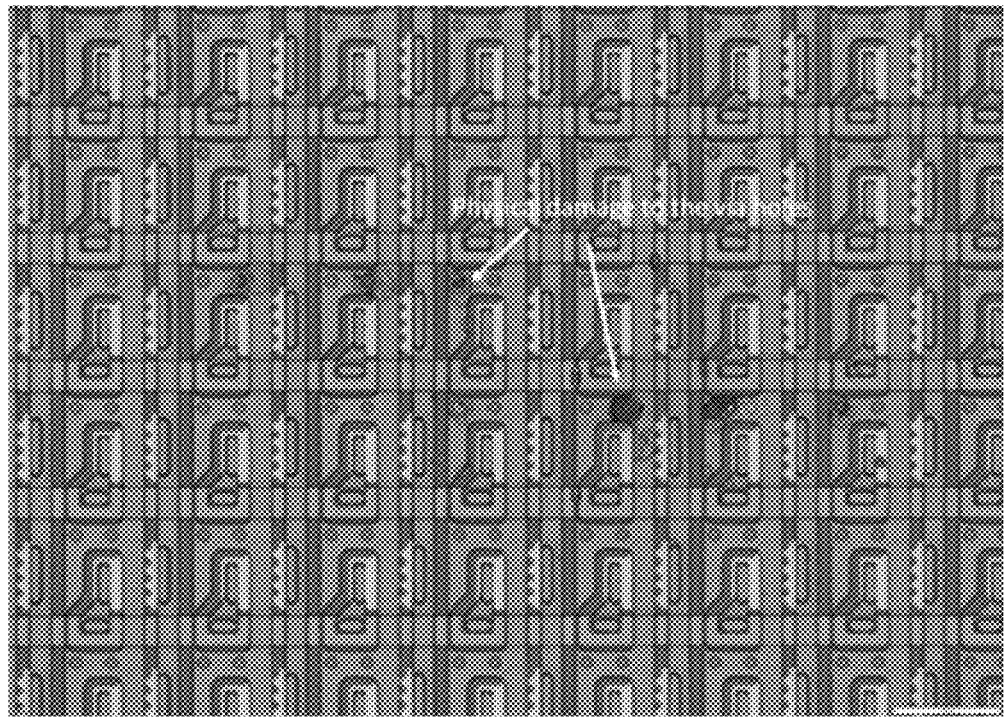
FIGS. 6A, 6B and 7A, 7B show microscope images of the ESD damage of an uncoated (no top hard coat layer) sensor and a coated sensor, respectively.
Figure 6B:
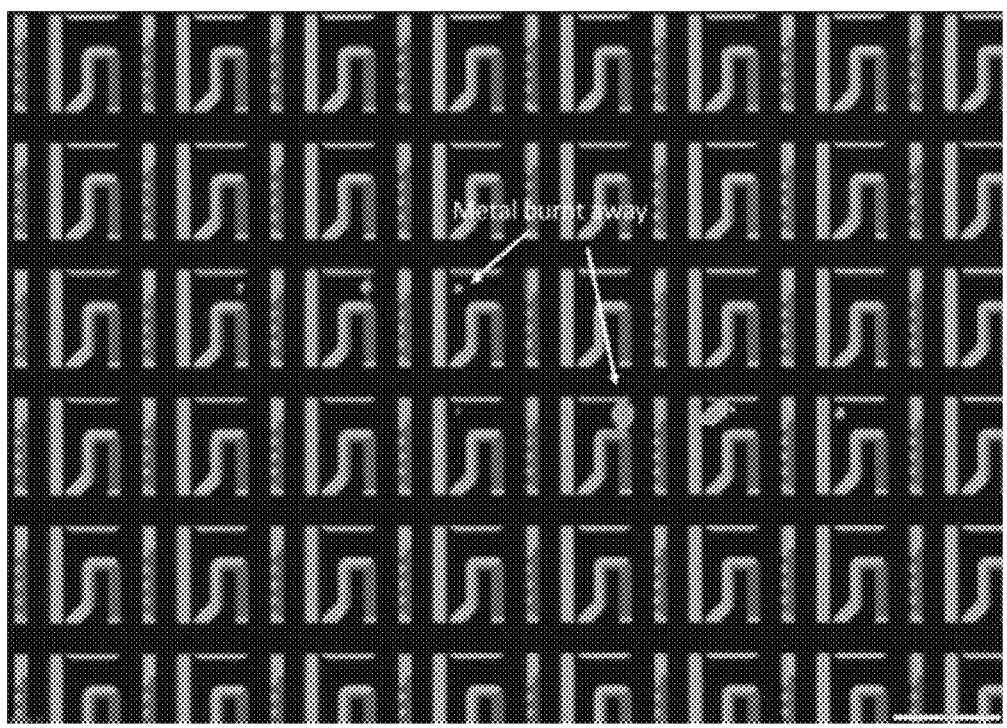
Figure 7A:
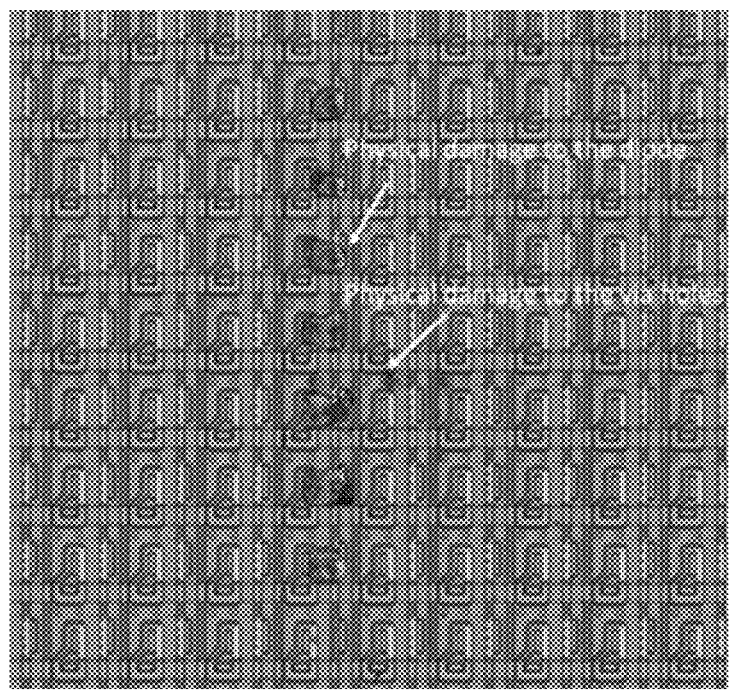
Figure 7B:
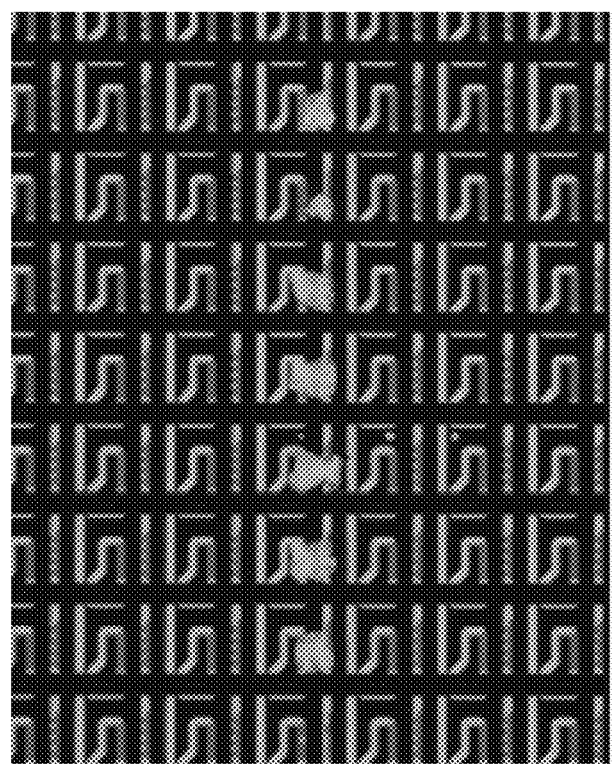

To provide additional mechanical protection, a top hard coat protection material (layer 68) is typically applied on top of the second insulating layer 66 (i.e., the passivation layer). The hard coat material may be a carbon based hard coat such as diamond-like-carbon (DLC), silicon nitride, or any other suitable non-conductive material or combination thereof. FIGS. 6A, 6B and 7A, 7B show microscope images of the ESD damage to an uncoated (no top hard coat) sensor and to a coated sensor with 0.4 μm-thick DLC coating, respectively, resulting after ESD test at +15 KV. Specifically. FIG. 6A shows a microscopic image of an ESD shocked uncoated sensor viewed with front light; FIG. 6B shows a microscopic image of the ESD shocked uncoated sensor viewed with back light; FIG. 7A shows a microscopic image of an ESD shocked DLC-coated sensor viewed with front light; and FIG. 7B shows microscopic image of the ESD shocked DLC-coated sensor viewed with back light.

The pixel design shown in the images (FIGS. 6A, 6B, 7A and 7B) already included a number of ESD protection schemes which are described in detail in the following sections. As seen from FIG. 6A, the uncoated sensor suffered minor damage, mainly at vias which are the low impedance paths to ground. Since the metal materials used are non-translucent, evaluation with the backlight of the same area reveals that part of the metal around the damaged vias is burnt away (see FIG. 6B). The ESD performance is degraded after application of the non-conductive top hard coating. As shown in FIG. 7A, more substantial ESD damage is seen deeper into the PIN diodes. Evaluation under the backlight (FIG. 7B) reveals that part of the diode materials including polysilicon and metal structures are also burnt away. The evidence leads the inventors to believe that the non-conductive hard coat film is a barrier to effectively redirecting ESD charge from the ESD protection layer. Using a conductive hard coat material is one alternative. Alternatively or additionally, multiple ground paths may be provided so that ESD charge can be dissipated quickly without damaging the active sensing pixels.

Figure 8:
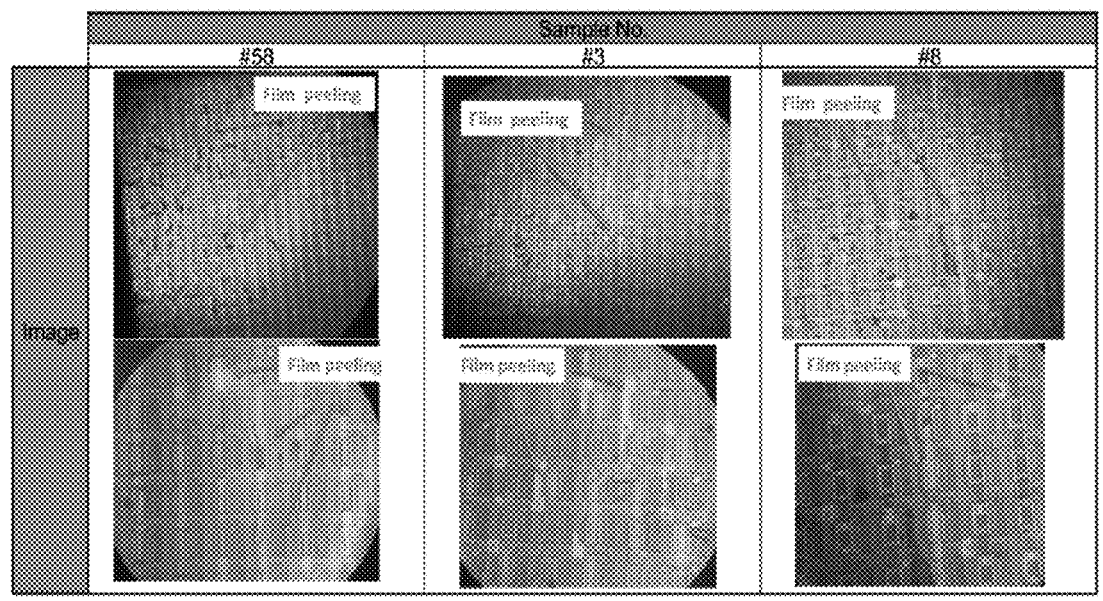
FIG. 8 shows microscopic images of sensors after reliability tests.

Another challenge with devices having the top hard coat layer is that it tends to add more internal stress between the layers. This can cause a top hard coat layer delamination during the accelerated reliability test (which is applied to some percentage (e.g., 1%) of manufactured devices) under high temperature and high humidity. This delamination issue is particularly evident when a stripe pattern (discussed below) is applied as the ESD protection layer. For example, FIG. 8 shows microscopic images of such sensors after reliability test under 70° C./90% relative humidity (RH) in the chamber for 120 hours. Flakes of top hard coating material are seen delaminating from the sensor surface due to the high stress introduced from the thin and long stripe pattern. Therefore, to minimize internal stress, the layout of ESD protection layer has to be carefully designed.

To protect the device from ESD shock, ground shield or grounded metal are often used to provide a low impedance electrical path to redirect the ESD charge away from the sensitive active thermal devices, particularly the metal addressing lines. One way is to dispose a grounded ESD protection layer 80 over the second insulator, as shown in the pixel structure 50A of FIG. 9. In this case, electrostatic charges may travel within the added conductive ESD protection layer 80 and reach ground, leaving the second and first metal layers 54, 52 intact. Localized damage may still occur due to the high power, which may result in localized film delamination. However, this would only cause a non-uniform image which can be recovered through software programming. The ESD protection layer 80 may be constructed using any conductive material, including, but not limited to, aluminum, molybdenum, Indium-Tin-Oxide (ITO), Indium-Zinc-Oxide (IZO), aluminum nitride, titanium, Ag, Ag nano wires, Ag nano particles, carbon nanotubes (CNTs) and the combination of thereof. Preferably, the conductive layer 80 may be a hard layer so as to provide mechanical protection. That is, in embodiments the material is selected to provide a preferred and in embodiments optimal combination of electrical conductivity and mechanical hardness. Given two materials and assuming conductivity and fabrication process are acceptable for both, the material with greater hardness is preferred to provide extra protection in addition to the optional hard coat layer. The conductive layer 80 may also be chosen for esthetic purpose, such as to exhibit certain colors.

There are a number of different arrangements by which the ESD protection layer can be disposed over the second insulator. This includes depositing the ESD protection layer over the entire area (i.e., blanket deposition), patterning it into a mesh structure, arranging it in a stripe pattern, or patterning it into individual unconnected islands. As discussed above, the ESD protection layer may be patterned in such a way that it provides a planarization effect and thus further mechanical protection for the sensor device. For example, the ESD protection layer may be patterned in a mesh, columns or islands format, so that it is substantially only deposited onto shallow areas present in the second insulation layer 66. An example is depicted in the pixel structure 50B of FIG. 10, which is identical to pixel structure 50A of FIG. 9 except for hard coat layer 68A and conductive ESD protection layer 80A. Specifically, the ESD protection layer 80A is disposed partially over the second insulating layer 66 to minimize the overlap with the second metal layer 54. This results in a smoother topology on the top surface, specifically as provided by the hard coat layer 68A, which enhances the scratch resistance of the sensor. The thickness of the ESD protection layer may be fine-tuned to make the upper surface of the hard coat layer 68A substantially flat.

Figure 9:
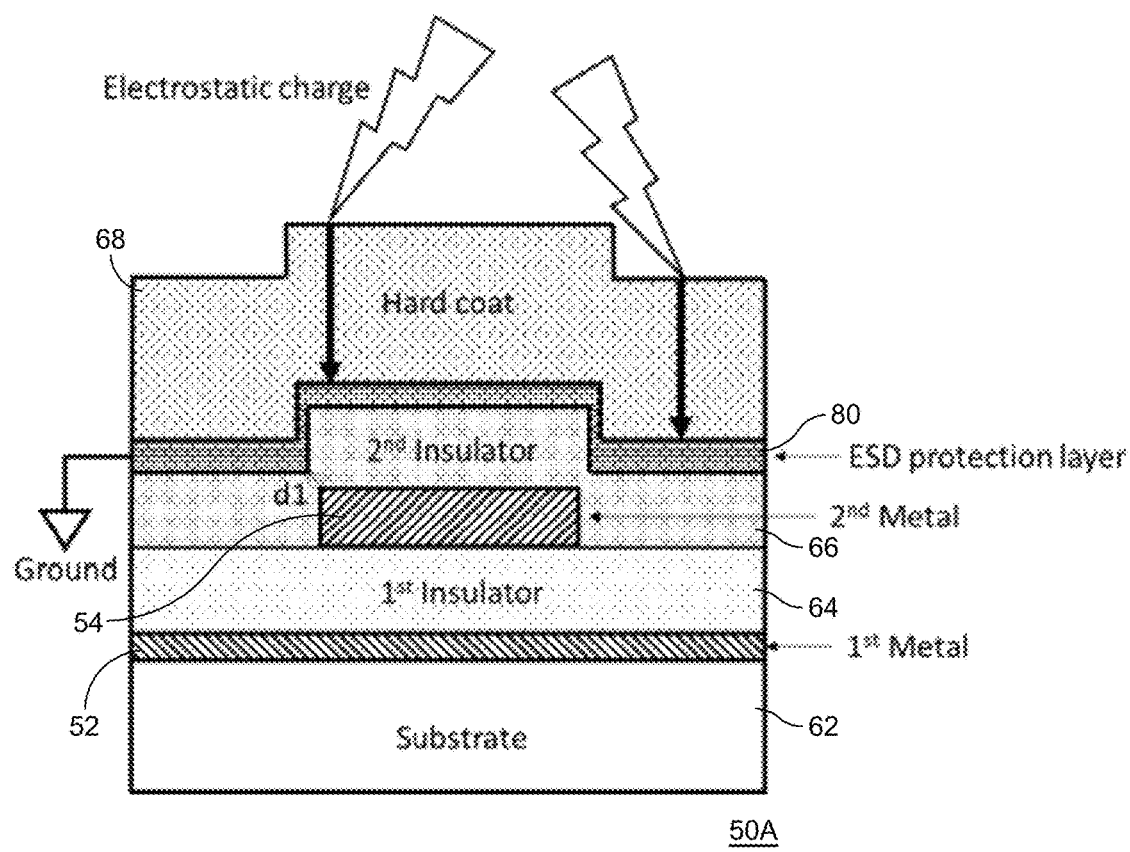
FIG. 9 illustrates an embodiment of a pixel structure having a blanket formed ESD protection layer.
Figure 10:
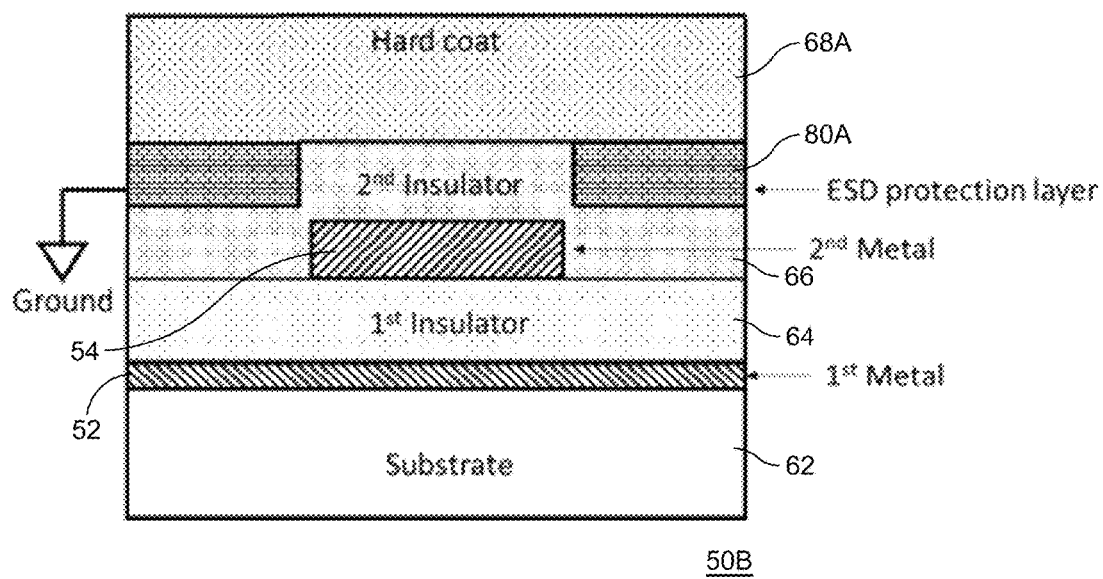
FIG. 10 illustrates another embodiment of a pixel structure having an ESD protection layer in stripe or mesh form.
Figure 11:
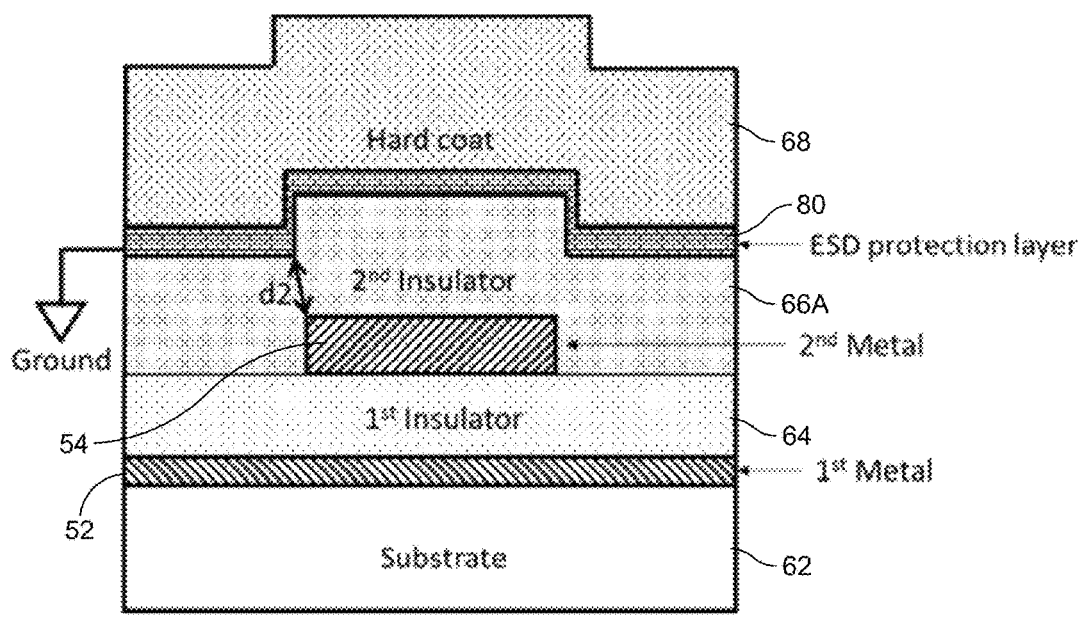
FIG. 11 illustrates another embodiment of a pixel structure having an ESD protection layer spaced an increased distance from an underlying metal layer.
Figure 12:
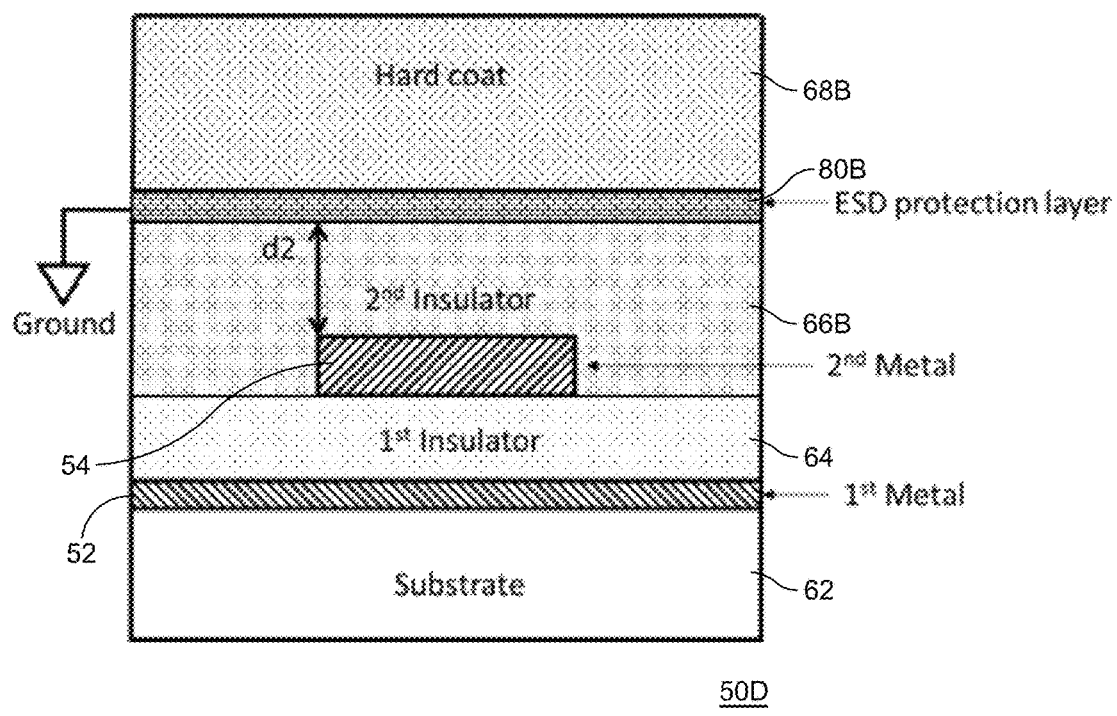
FIG. 12 illustrates another embodiment of a pixel structure having an ESD protection layer spaced from an underlying metal layer by a planarizing insulation layer.

One risk of the ESD protection layer described in connection with FIGS. 9 and 10 is that the underneath metal layers underneath (e.g., metal layers 52, 54) could be potentially shorted to this conductive ESD protection layer upon external force, such as a scratch, a drop, or through constant wear. As shown in FIG. 9, distance d1 is the minimum spacing between the top corner of the second metal layer 54 and the bottom corner of the ESD protection layer 80. This could be a weak point where an electrical short could occur when excessive external mechanical stress is applied. One solution is to increase the thickness of the second insulating layer 66A so as to extend the spacing, as illustrated in the pixel structure 50C of FIG. 11 where d2 is greater than d1. The distance d2 can be selected based on the thickness and hardness of the insulating layer, i.e., the thickness and harness of the layer can be selected to provide the desired protection against unwanted electrical shorts. In embodiments, d2 is between about 100-1000 nm. In embodiments, the second insulating layer is a thick planarization layer 66B that smooths the topology of the ESD protection layer 80B and thus the hard coat layer 68B, as shown in the pixel structure 50D of FIG. 12.

Figure 13:
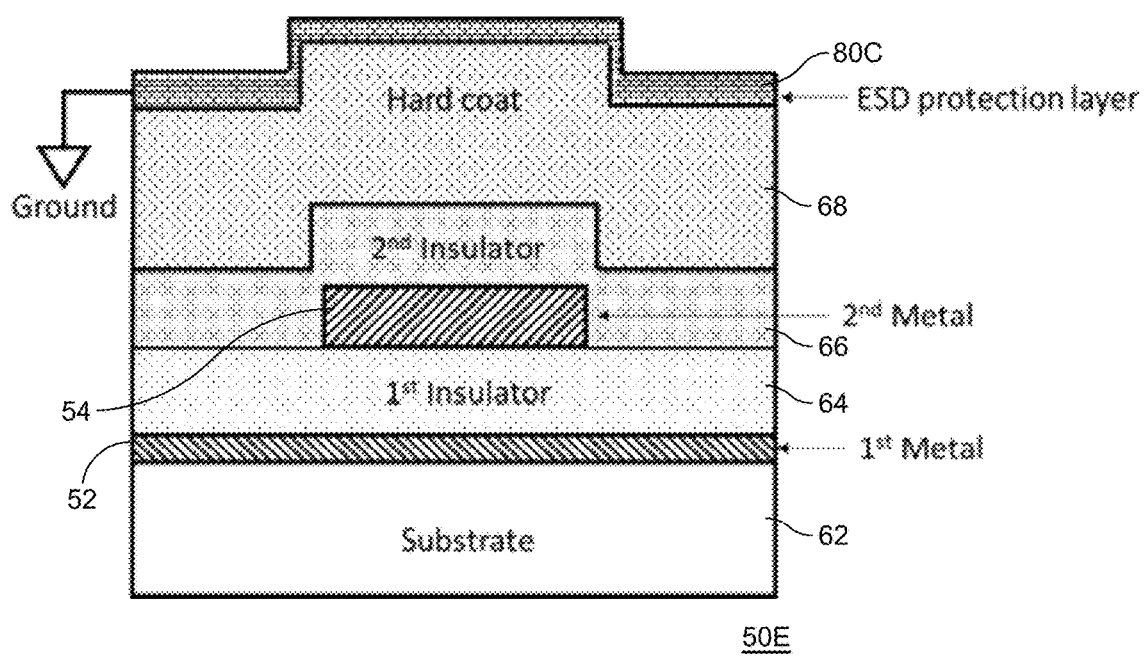
FIG. 13 illustrates another embodiment of a pixel structure having an ESD protection layer over a hard coat layer.

In an alternative embodiment, the conductive ESD protection layer 80C may be disposed over the hard coat layer 68, as shown in the pixel structure 50E of FIG. 13. In embodiments, the insulating layer 66 may be, but is not limited to, silicon nitride, acrylic based polymer, silicon oxide and the combination thereof. The means to prevent interlayer metal shorting is not limited to the above three examples (FIGS. 11-13) and other techniques may be employed in embodiments.

Figure 28:
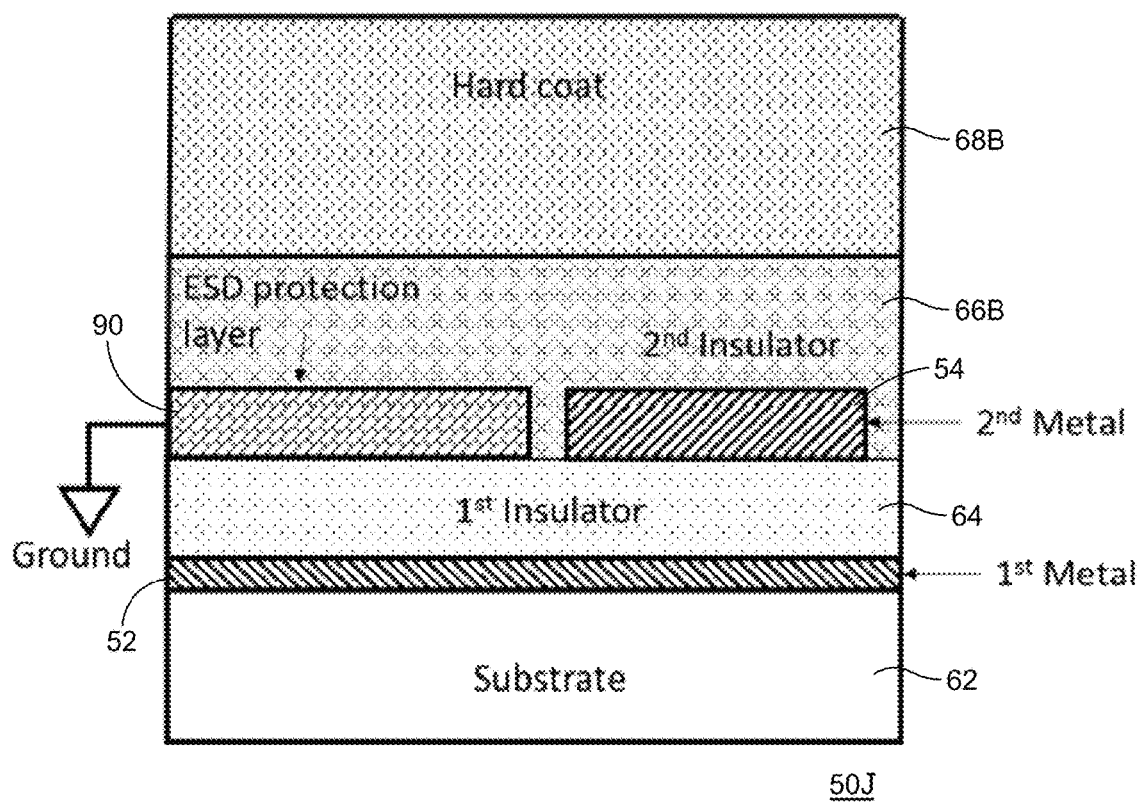
FIG. 28 illustrates an alternative embodiment of a pixel structure having an ESD protection layer.

Another single layer ESD protection layer embodiment is illustrated in FIG. 28. FIG. 28 illustrates a pixel structure 50J having a conductive ESD protection layer 90 formed in the same plane as second metal layer 54. The ESD protection layer 90 is electrically connected to a bias, preferably a system ground. The ESD protection layer 90 may be formed along with the second metal layer 54, so as to reduce manufacturing cost and complexity.

Figure 14:
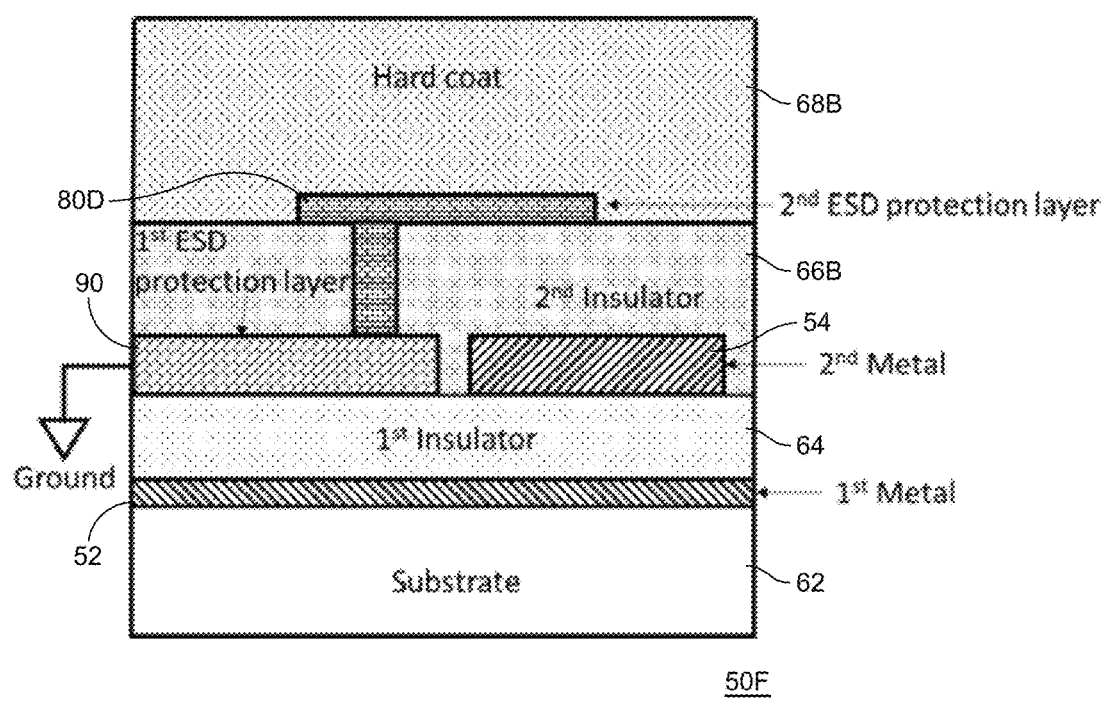
FIG. 14 illustrates an embodiment of a pixel structure having two vertically separated ESD protection layers.

In another embodiment, two ESD protection layers may be used. FIG. 14 illustrates a pixel structure 50F where a first conductive ESD protection layer 90 is disposed in the same level or plane as the second metal layer 54, and a second conductive ESD protection layer 80D is disposed over the first ESD protection layer 90. Insulating layer 66B is disposed between the two ESD protection layers 90, 80D. The second ESD protection layer 80D may be electrically connected to the first ESD protection layer 90 locally in each sensing pixel through one or more conductive vias 85 formed in the insulating layer 66B.

The first ESD protection layer 90 may be formed at the same time as the second metal layer 54. The first ESD protection layer 90 is electrically connected to ground. This first ESD protection layer 90 may be patterned to help planarize the overall device topology. That is, the first ESD protection layer 90 may be deposited so as to fill in the lower areas (valleys) that would otherwise exist if only the second metal layer 54 were present at this layer/level, thus levelling the overall second insulating layer 66B and thus the hard coat layer 68B formed thereover. In embodiments, the first ESD protection layer 90 may be disposed over the active sensing element, such as the intrinsic region of the PIN diode. In embodiments, the second ESD protection layer 80D may be disposed as isolated islands, preferably at last partially over each active sensing element (i.e., PIN diode). In such case, the purpose of the second ESD protection layer 80D is to provide a lower impedance path attracting ESD charge as a "lightning rod" and to redirect charge to the grounded first ESD protection layer 90 through vias 85. Alternatively, the second ESD protection layer 80D may be electrically isolated from the first ESD protection layer 90 locally in each sensing pixel, but electrically grounded separately outside the active pixel area, as depicted in the embodiment of a pixel structure 50G in FIG. 15. In that embodiment, second ESD protection layer 80B acts as a double shield to provide additional ESD protection.

Figure 16:
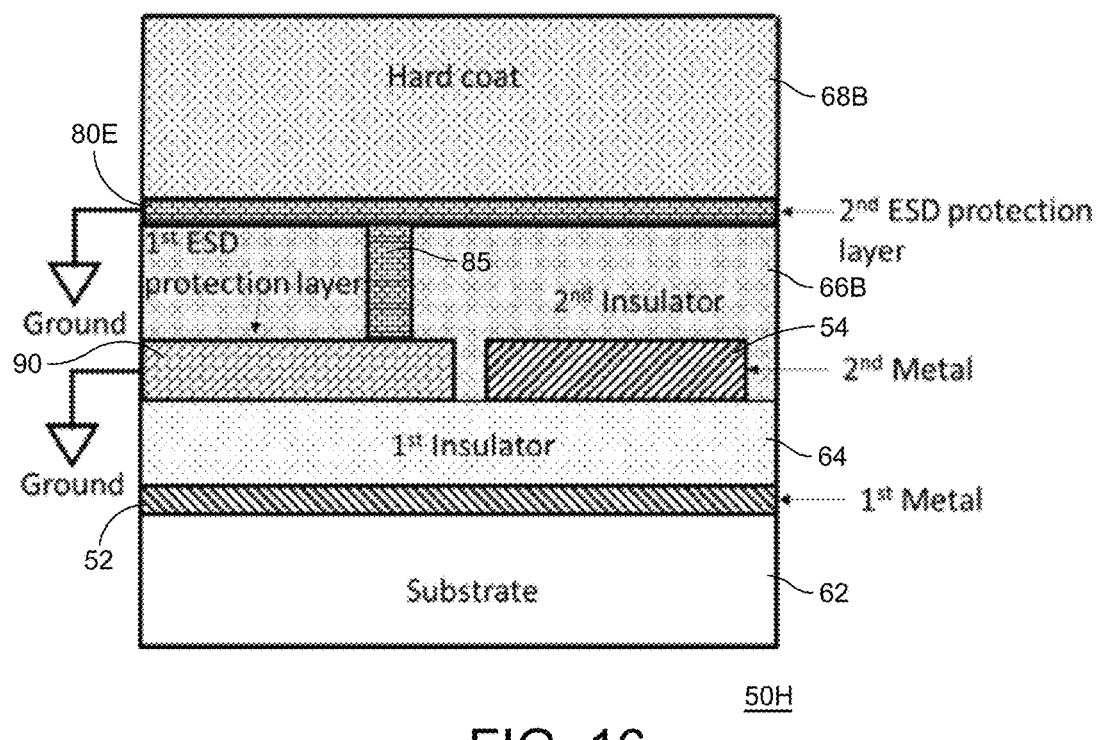
FIG. 16 illustrates another alternative embodiment of a pixel structure having two vertically separated ESD protection layers.

In another embodiment illustrated in the pixel structure 50H of FIG. 16, the second ESD protection layer 80E may be electrically connected to the first ESD protection layer 90 locally in each sensing pixel and both are grounded outside the active pixel area. Alternatively, an additional grounded line can be buried on the same plane as the first metal layer 52, and the second ESD protection layer 80E may be connected to the first metal grounded line through one or more vias, as described for example in connection with FIG. 27.

Figure 26A:
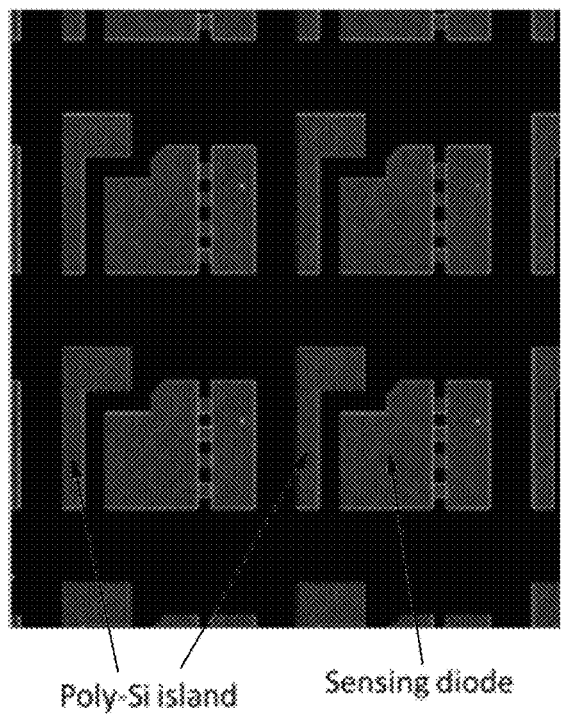
FIGS. 26A to 26C illustrate a design layout of an embodiment having a doped polysilicon island in each pixel area for ESD protection.
Figure 26B:
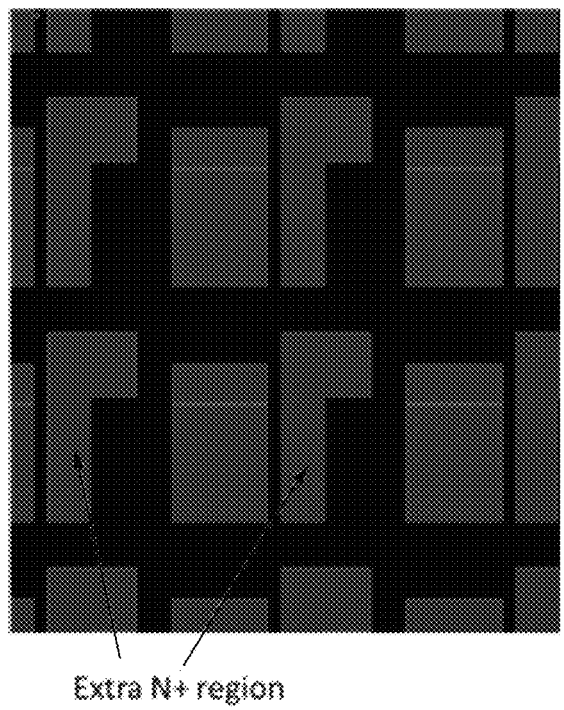
Figure 26C:
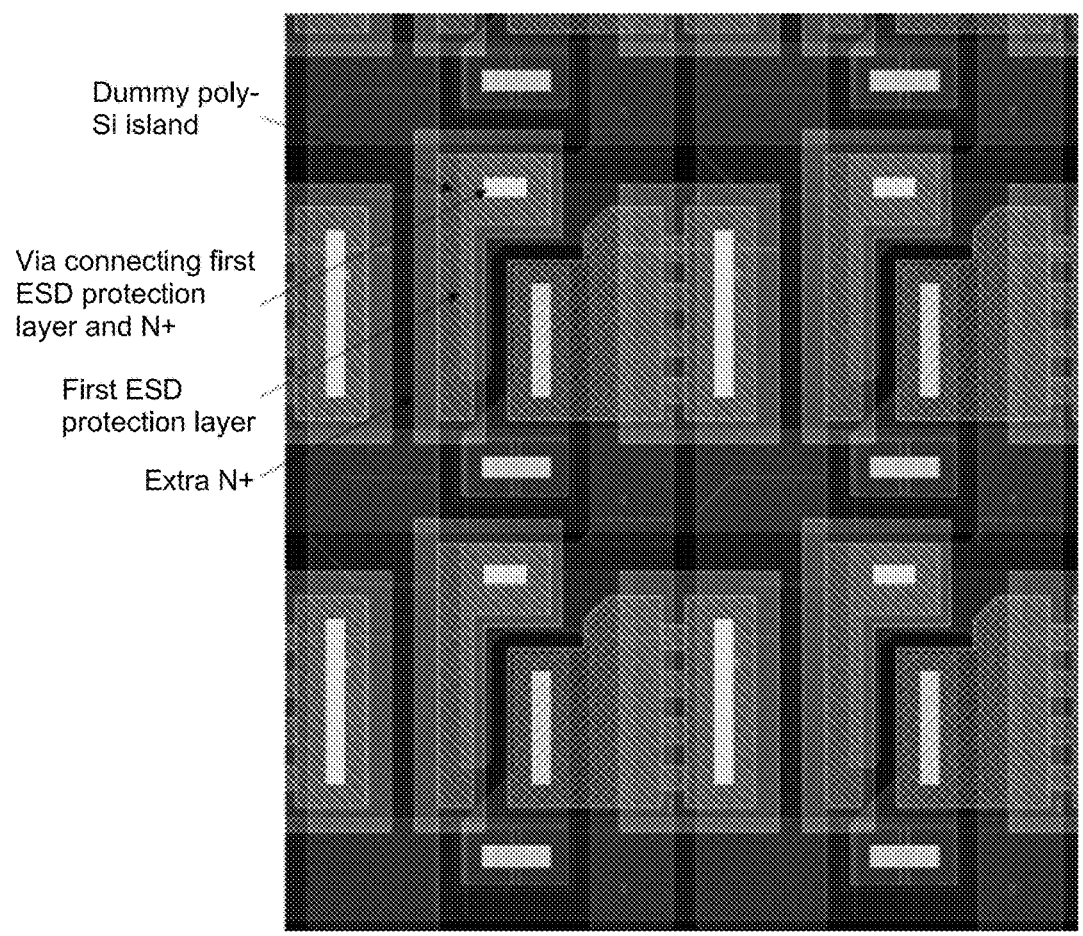

As shown in FIGS. 4A and 4B, multiple PIN diodes may be damaged during an ESD shock. Even though a low-impedance ground path is provided, ESD charge is still attracted to the diode underneath. This may be due to the fact that each PIN diode offers ion-implanted N+ and P+ poly-silicon regions, which act essentially as reservoirs saturated with particles of the opposite charge for the ESD charge to recombine with. Another possible reason is that the heavily doped polysilicon regions have defects that are more likely to absorb external energy. As such, in embodiments additional N+ and/or P+ regions may be added within each sensing pixel, which are shown in FIGS. 26A to 26C described later in this disclosure. However, these regions must be electrically isolated from the sensing PIN diode to minimize ESD damage. The N+ and/or P+ regions may be electrically connected to the first ESD protection layer through vias, and the first ESD protection layer may be electrically grounded.

It is important that the ESD protection layer is electrically connected to a bias potential, preferably the system ground. There are various ways to provide electrical grounding. For instance, a pad may be formed on the substrate and be bonded to external ground in a subsequent process, and the ESD protection layer may be patterned to make contact to this ground pad. In embodiments, especially when the ESD protection layer is disposed over the hard coat layer as shown in, for example, FIG. 13, the grounding may be created through an external bezel made of conductive material and the bezel may be connected to the ground (or other bias potential) on the external circuitry board.

PRODUCTION EXAMPLES

As described below, fingerprint sensors were fabricated with disclosed ESD protection approaches. ESD performance, scratch resistance, and reliability were tested.

1st Production Example

The first production example of the fingerprint sensor was implemented with the structure described in connection with FIG. 9, where an ESD protection layer 80 is disposed over the entire second insulating layer 66 like a blanket, followed by application of the hard coat layer 68. The ESD protection layer 80 was disposed onto a contact pad connected to external ground. The second insulating layer 66 was a 5000 Å-thick silicon nitride layer deposited though plasma-enhanced chemical vapor deposition (PECVD). The ESD protection layer 80 was a 2000 Å thick Molybdenum (Mo) layer, with a sheet resistance of approximately 0.6 ohm/sq. The hard coat layer was a 1900 Å-thick silicon nitride layer followed by a PECVD deposited 1.2 µm-thick Diamond-Like-Carbon (DLC) layer.

Figure 17A:
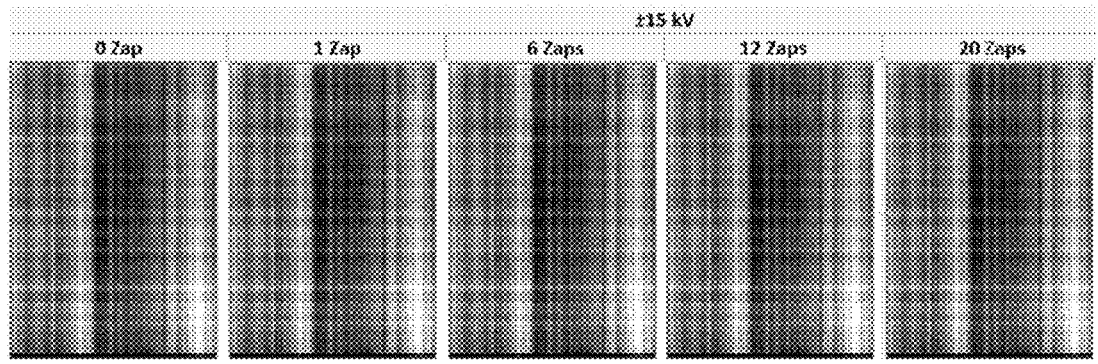
FIGS. 17A and 17B show ESD test functional images from a fabricated device according to an embodiment.
Figure 17B:
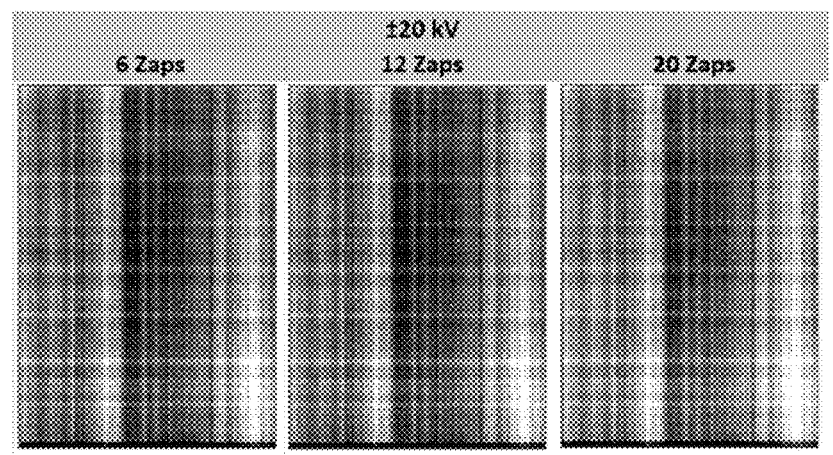
Figure 18A:
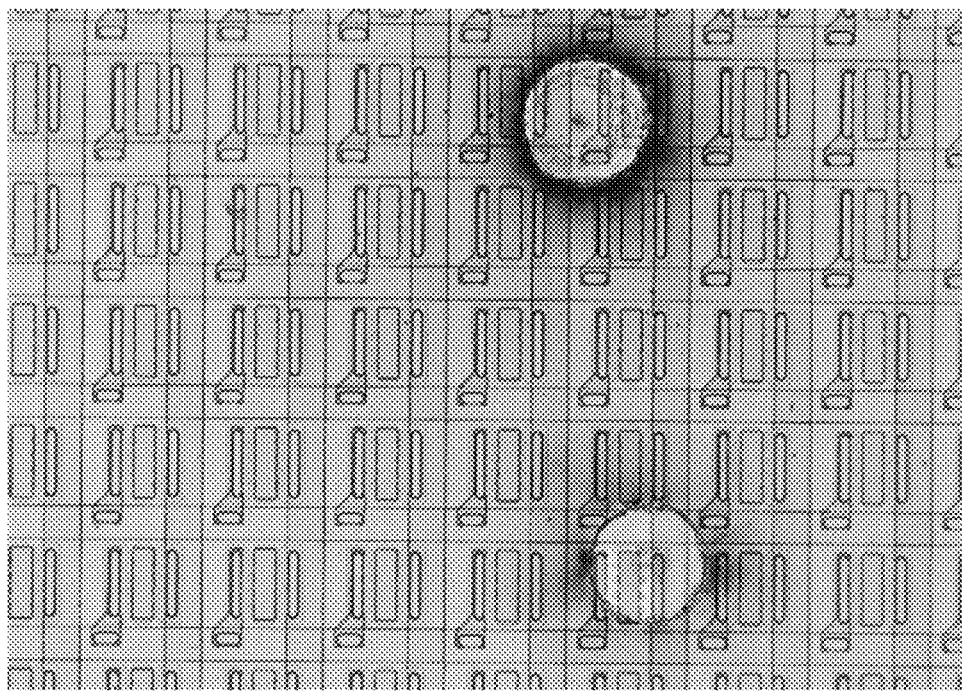
FIGS. 18A and 18B are microscopic images of ESD zapped areas from a first embodiment of a fabricated device at low and high magnification, respectively.
Figure 18B:
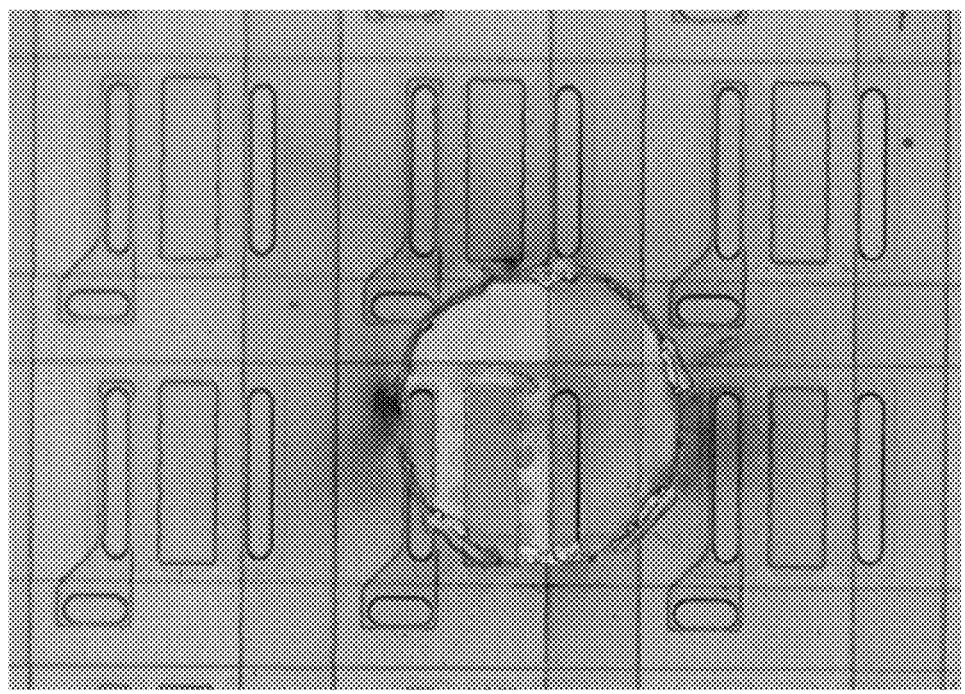

ESD performance was tested using an ESD simulator (Schaffner NSG 438) at ±15 KV and ±20 KV. The functional images from the fingerprint sensor before and after the ESD shocks are shown in FIGS. 17A and 17B. Specifically, FIG. 17A shows (from left to right) the image captured by the fabricated device (without a finger present) with up to 20 zaps at ±15 KV, and FIG. 17B illustrates the same at ±20 KV. Other than some minor damage, the functionality of the device stayed substantially the same. The bright spots correspond to where the high power ESD charge damaged the layers above the second metal layer, and thus the thermal signal became stronger. The affected image areas can be substantially recovered through software programing. FIGS. 18A and 18B are the microscopic images of those zapped spots at low and high magnification, respectively. Even though portions of the layers above the second metal layer were damaged by the ESD shock, the underlying active devices stayed intact. The affected area of the Mo shield layer are typically small, averaging about 50 µm in diameter, which is approximately the size of a pixel. More importantly, the first and second metal layers were protected and no catastrophic failure was found. Compared to the performance of a like fingerprint device (as illustrated in FIG. 3) with no ESD protection, as shown in FIGS. 4 and 5, the difference is significant.

2nd Production Example

Figure 19:
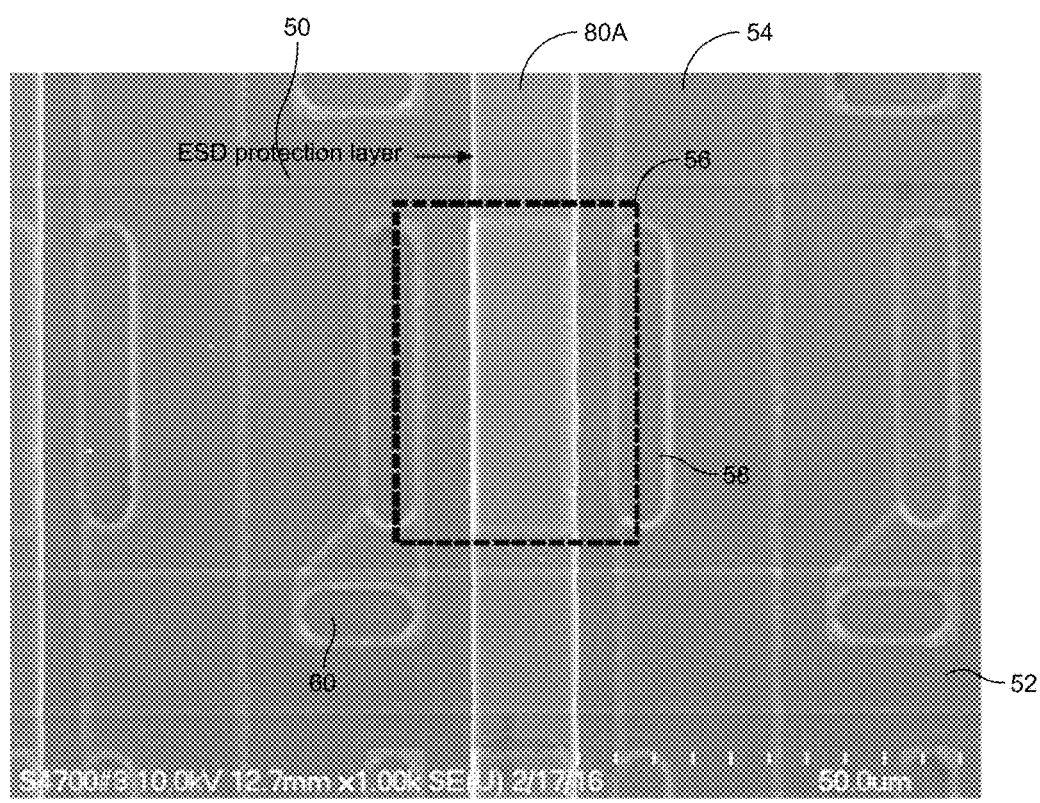
FIG. 19 is a SEM image of a fingerprint sensor with a striped ESD protection layer formed across the active sensing elements.

A second production example of the fingerprint sensor was implemented with the structure described in connection with FIG. 10. An ESD protection layer was deposited over the entire active area and then patterned into an array of stripes 80A disposed over the intrinsic area of the sensing diodes. The ESD protection layer was electrically grounded only at the edge of the active area. An SEM image of the pixel area is shown in FIG. 19 and the ESD protection layer (stripe) 80A is labelled. An advantage of this design is that the ESD protection layer 80A does not overlap with the second metal layer 54, thus minimizing the potential of shorting between the ESD protection layer 80A and the second metal layer 54 upon external force (wear or scratch during normal usage). Compared to the first production example, the ESD performance of this design is expected to be slightly lower because of the limited amount of ESD protection material used. However, the performance can be improved by reducing the sheet resistance of the ESD protection layer 80A and using a thinner top hard coat layer to allow stronger attraction to the ESD charge. The ESD protection layer used in this design was a 4000 Å-thick Molybdenum (Mo) layer, with a sheet resistance of approximately 0.3 ohm/sq. The hard coat layer included a 1900 Å-thick silicon nitride and a reduced thickness 0.3 µm-thick PECVD deposited Diamond-Like-Carbon (DLC) coating.

Figure 20:
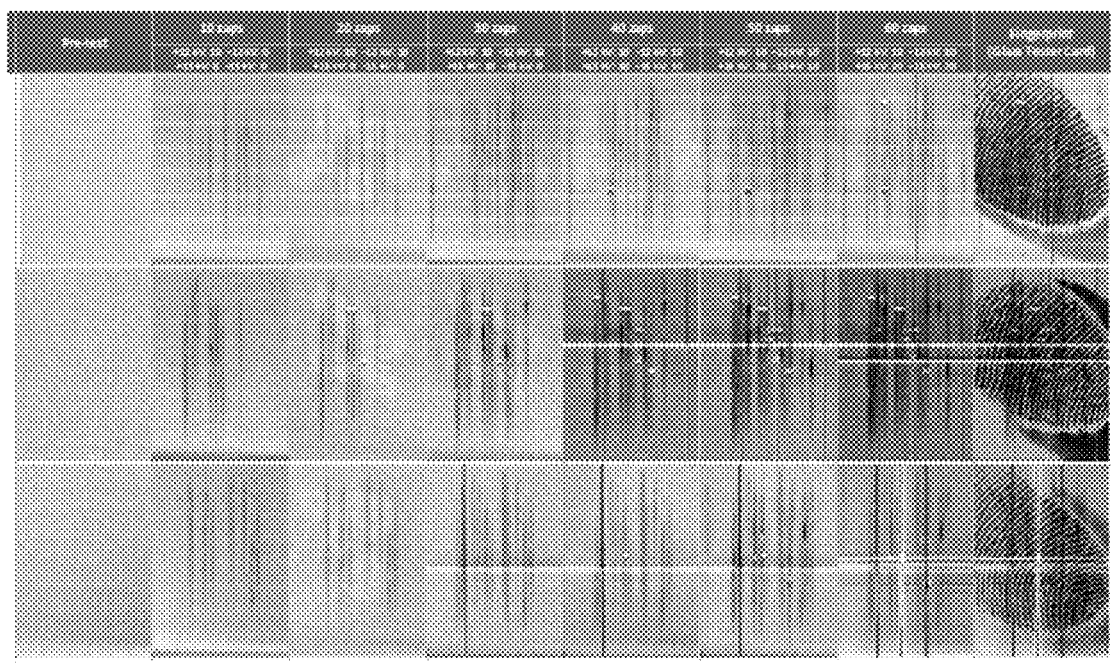
FIG. 20 shows ESD test functional images from a second fabricated device according to an embodiment.

ESD test results for the second production example are shown in FIG. 20. The fabricated fingerprint sensors were zapped with the same ESD gun used to test the first production example for up to a total of 60 zaps (10 zaps each at +/−12 KV followed by 20 zaps each at +/−15 KV). A number of pixels and sensor rows and columns are damaged, but the vast majority of the sensor pixel array is still in working condition, which is shown by the valid fingerprint images illustrated in FIG. 20. Since the ESD damage is limited, some of the damaged pixels can be recovered through software techniques, which further minimizes the overall ESD event impact and extends the life of the fingerprint sensor.

Figure 21A:
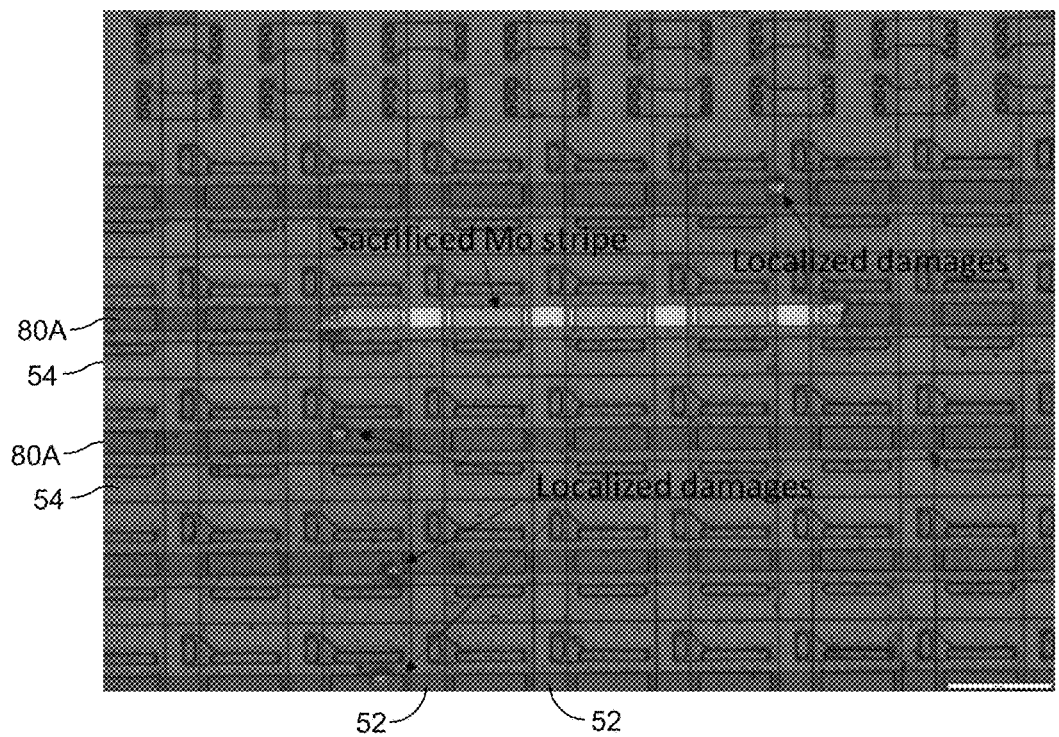
FIGS. 21A and 21B are microscopic images at lower and higher magnification, respectively, of fingerprint sensors with a striped ESD protection layer after ESD zaps.
Figure 21B:
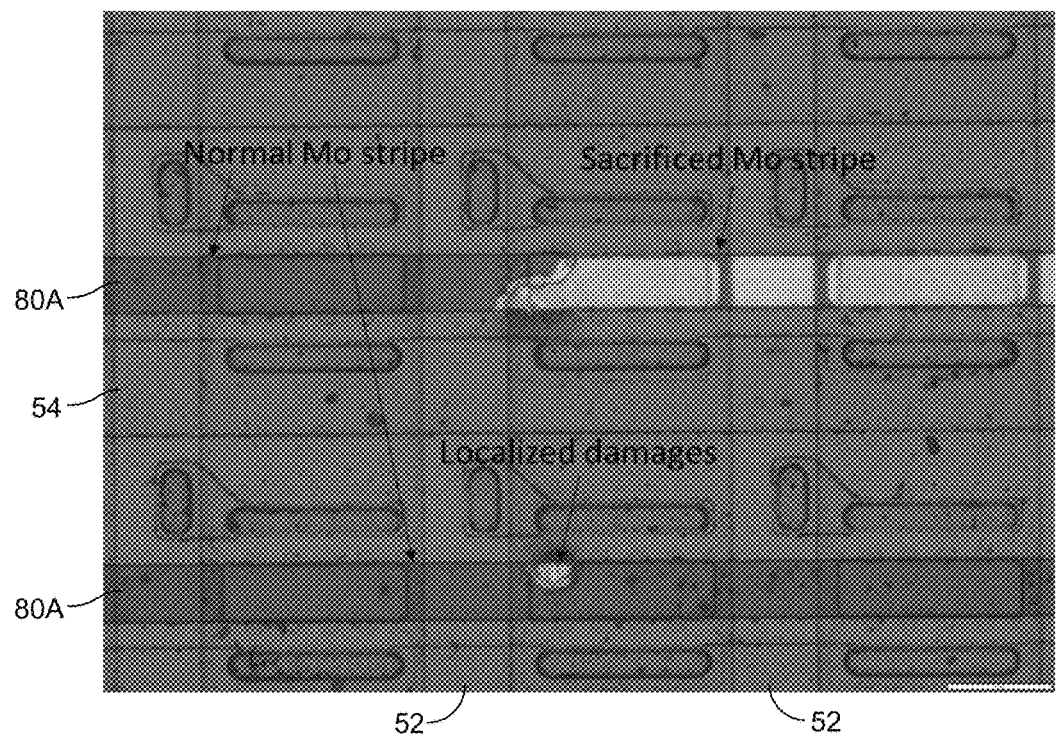

Microscopic images of the localized damage are shown in FIGS. 21A and 21B under lower and higher magnifications, respectively. With lower ESD voltage levels (such as 2 KV and 4 KV), damage is usually localized in a small area on the Mo layer (the ESD protection layer) and part of the top hard coat is usually removed. With higher ESD voltage level, stripes of top hard coat layer and part of the Mo layer are often blown away exposing the lower layers. As described earlier, the Mo ESD protection layer provides a low impedance path to ground allowing the strong electric field created by the ESD gun to repel charges of the same polarity while saturating with charges of the opposite polarity on the surface. The ESD charge races toward the surface of the Mo creating a trail of plasma. The finite resistance of the Mo turns the ESD charge energy into heat causing a sudden rise in temperature in the affected area. The Mo ESD protection layer acts as a sacrificial layer (by absorbing the heat and being melted) to prevent the ESD charge from attacking or penetrating down to the active thermal sensing pixels and circuitry. This is apparent by the fact that all damages follow the stripe that corresponds to the conductive layer (Mo) pattern in this production example, while the explosion is typically an isotropic circle in the first production example where the conductive layer universally covers the active area. This is a significant enhancement compared to the fingerprint device with no ESD protection in FIG. 3.

It should also be pointed out that a sensor device with patterned ESD layer (e.g., the second production example) exhibits greater mechanical robustness comparing to the blanket ESD protection layer (e.g., the first production example), owing to the minimized overlap (preferably no overlap) between the ESD protection layer and the second metal layer.

3rd Production Example

Figure 22A:
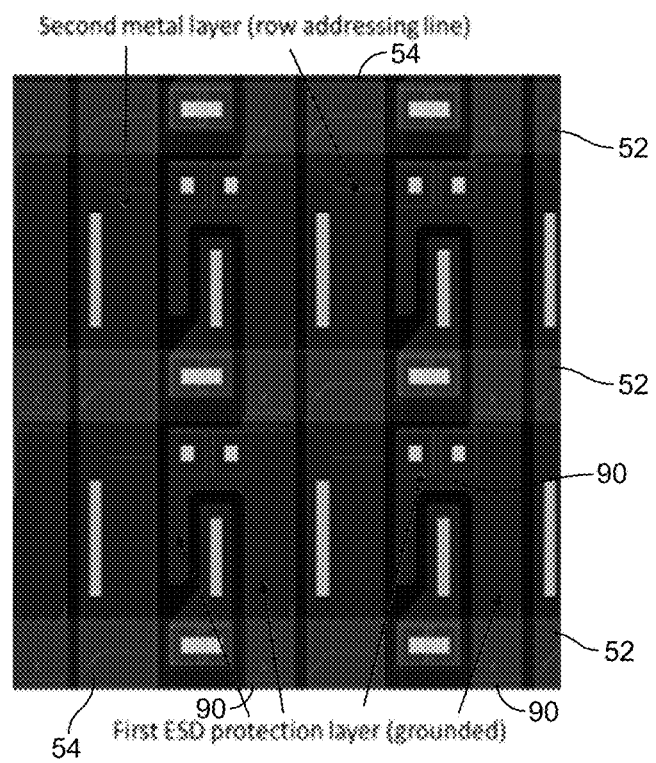
FIGS. 22A to 22C are design layouts of a third production example of a sensor device having ESD protection.
Figure 22B:
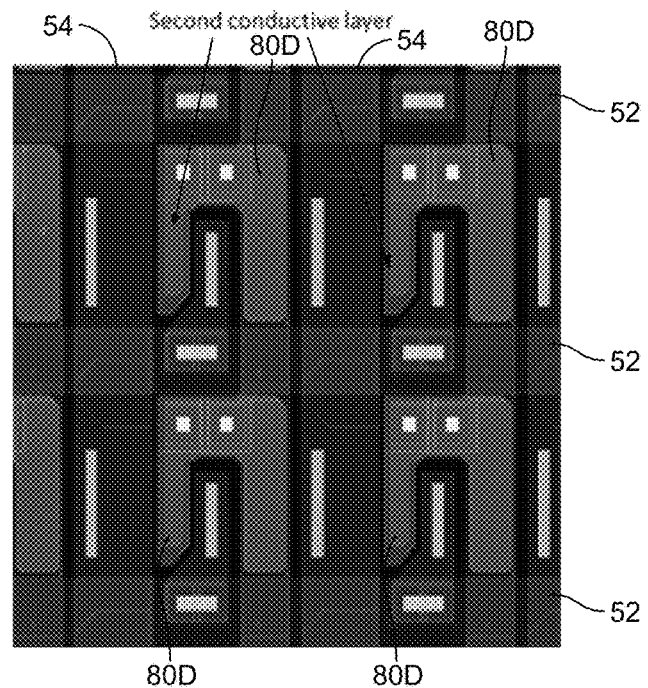

A third production example was implemented having a two-layer ESD protection structure as described above in connection with FIG. 14. The design layout is shown in FIGS. 22A and 22B. A first ESD protection layer 90 (FIG. 22A) partially covers the sensing element, i.e., the intrinsic region of each PIN diode, and electrically connects to ground. In particular, this layer is patterned such that it fills up the "valleys" as much as possible for planarization purposes. To simplify the fabrication process, the first ESD protection layer 90 used in this embodiment is patterned along with the second metal layer 54 which is used for row addressing lines. This allows the first ESD protection layer 90 and the second metal layer 54 to share the same mask layer and material recipe. Alternatively, the first ESD protection layer 90 may also be disposed separately from the second metal layer 54 should a different recipe (either the material and/or the deposition thickness) be used to achieve higher conductivity and/or better planarization effect.

Figure 22C:
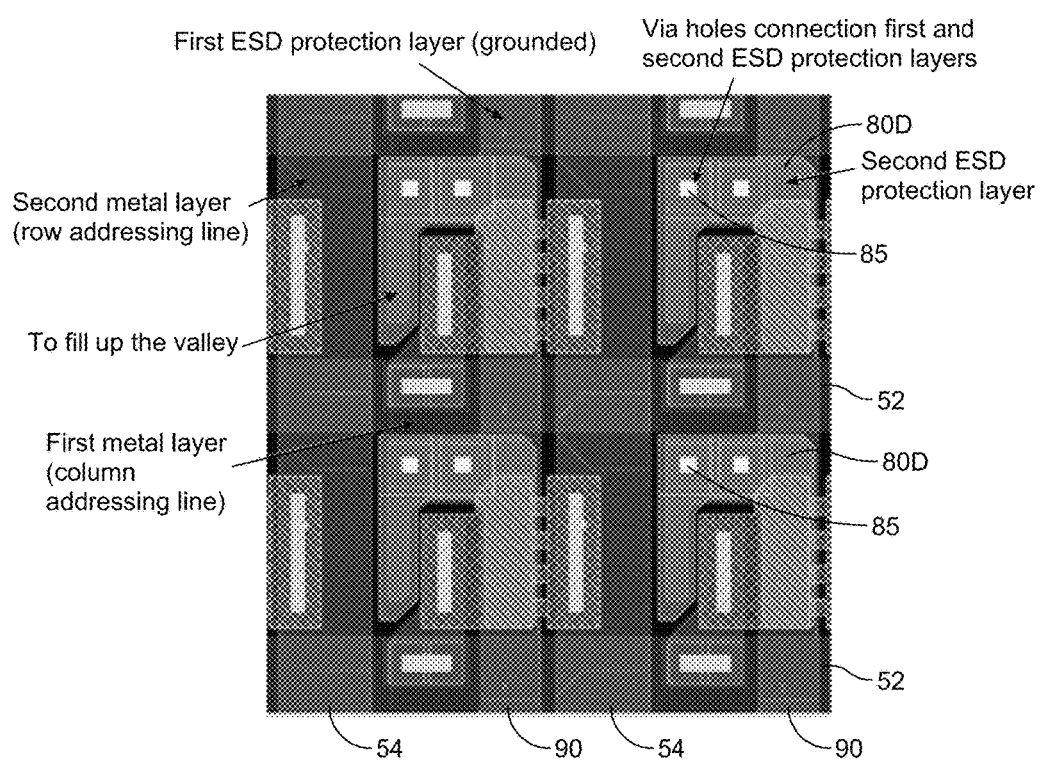

The second insulating layer 66B is disposed over the first ESD protection layer 90 and the second metal layer 54, followed by a second ESD protection layer 80D. The second ESD protection layer 80D, which is disposed partially over the intrinsic region of the PIN diode, forms isolated islands within each sensing pixel (FIG. 22B). This second ESD protection layer 80D is then electrically connected to the first ESD protection layer 90 through vias 85 (shown in FIG. 22C). These isolated ESD protection structures serve two important purposes. First, these structures rise above the surrounding structures, which makes it more accessible to the ESD charge. Each of the islands acts like a "lightning rod" to attract and redirect the ESD charge to ground. Second, these islands can serve as sacrificial structures to absorb heat caused by the ESD event, which protects the sensing pixels underneath. The complete layout with all layers is shown in FIG. 22C.

The vias 85 connecting the first and second ESD protection layers 90, 80D should be strategically placed. That is, the vias 85 should provide a low-impedance path for the ESD charge to quickly reach the grounded first ESD protection layer 90 while avoiding overlap with any of the critical elements, such as the row and column address line metal layers 54, 52 and the active thermal PIN diode. In this embodiment, the vias 85 were placed in between the active thermal PIN diode and the metal addressing lines, as shown in FIG. 22C.

Figure 23:
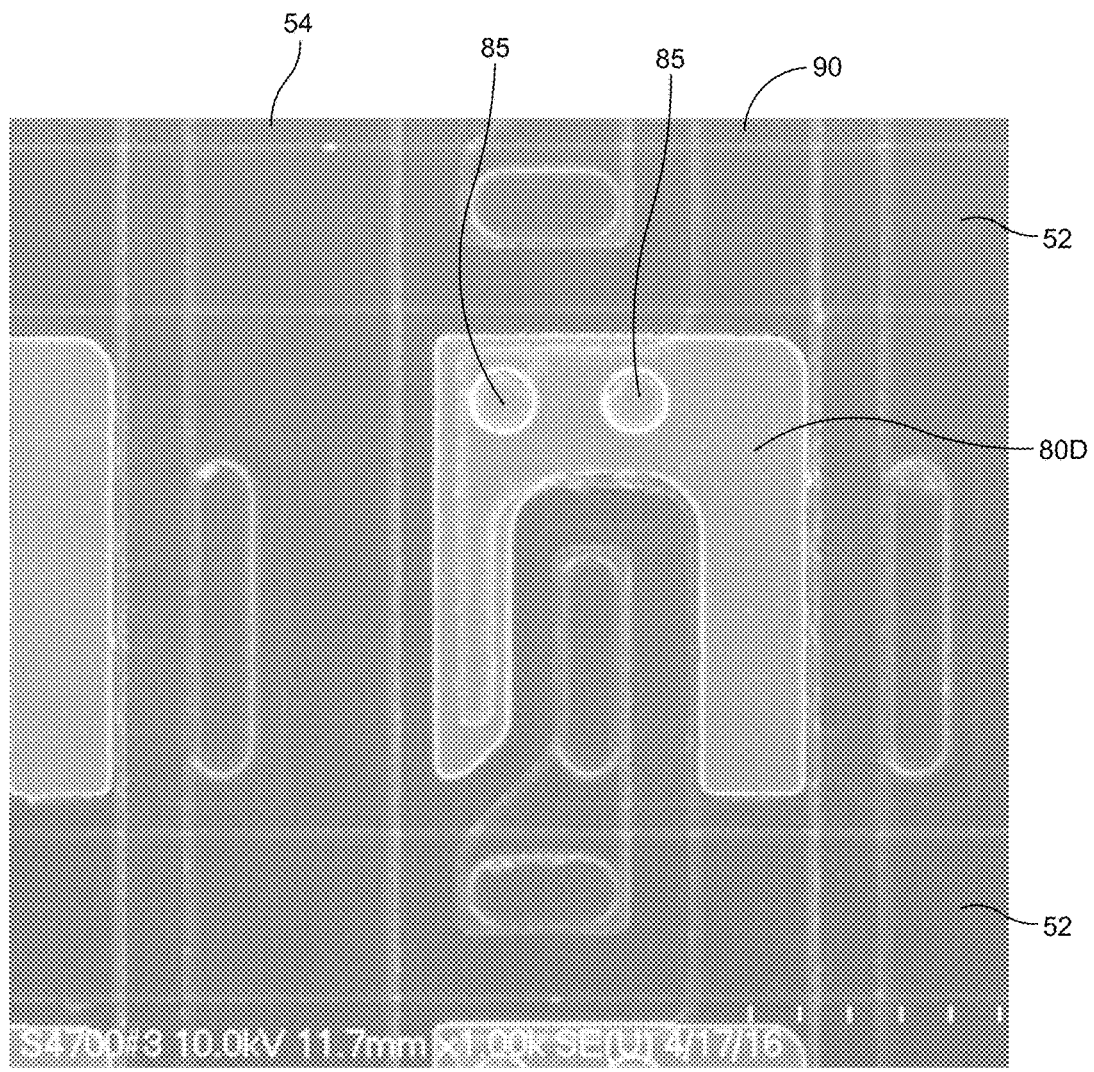
FIG. 23 is a SEM image of a pixel area of a third production example where two vertically separated conductive ESD protection layers are locally connected through vias.
Figure 24:
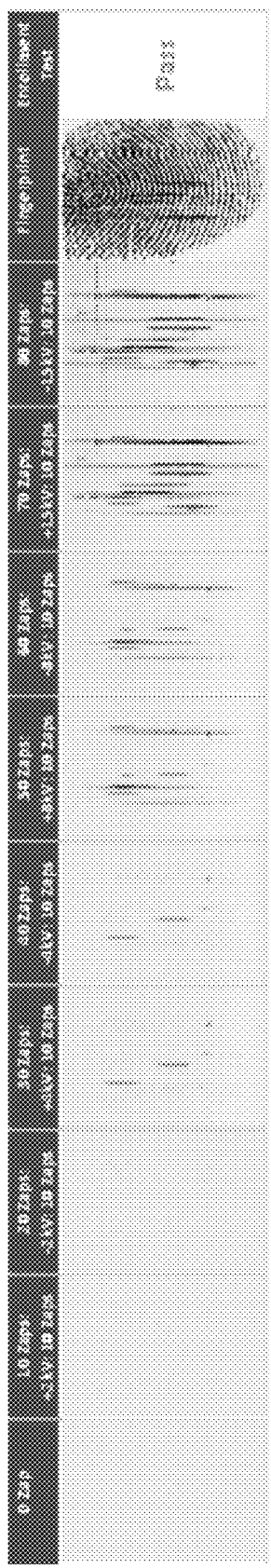
FIG. 24 shows ESD test functional images from a third fabricated device according to an embodiment.

This fingerprint sensor was fabricated and tested. The first ESD protection layer 90 was a 250 Å Mo/3000 Å Al/500 Å Mo layer with a sheet resistance about 0.1 ohm/sq, and it was patterned simultaneously with the second metal layer 54. The second insulating layer 66B was a 5000 Å-thick silicon nitride layer disposed over both the first ESD protection layer 90 and the second metal layer 54. The second ESD protection layer 80D was a 2000 Å-thick Mo patterned on top of the second insulating layer 66B with a sheet resistance of approximately 0.6 ohm/sq. Finally, a hard coat layer 68B was formed to encapsulate the active area including a 1900 Å-thick silicon nitride hard coat layer and a 0.4 µm-thick DLC layer. A SEM image of a pixel area without the top DLC layer is shown in FIG. 23. ESD performance was evaluated and the result is shown in FIG. 24. The sensor was tested at +/−2 KV, 4 KV, 8 KV, and 15 KV for 10 zaps each, for a total of 80 zaps. The ESD damage was minor enough that the sensor was still able to successfully enroll a new fingerprint and recognize a registered fingerprint. The scratch resistance of this production example was very similar to the second production example owing to the non-overlap between ESD protection layers 80D and 90, and second metal layer.

Finally, twenty-four samples of this third production example were tested for accelerated reliability in a chamber under 70° C./90% RH for 240 hours. None of the samples showed any sign of top DLC hard coat layer delamination. It is believed that by breaking up each long strip of the second ESD protection layer 80D (such as used in the second production example) into multiple isolated islands and by better planarization, the mechanical stress between different layers is reduced and the adhesion between layers is much improved.

Figure 15:
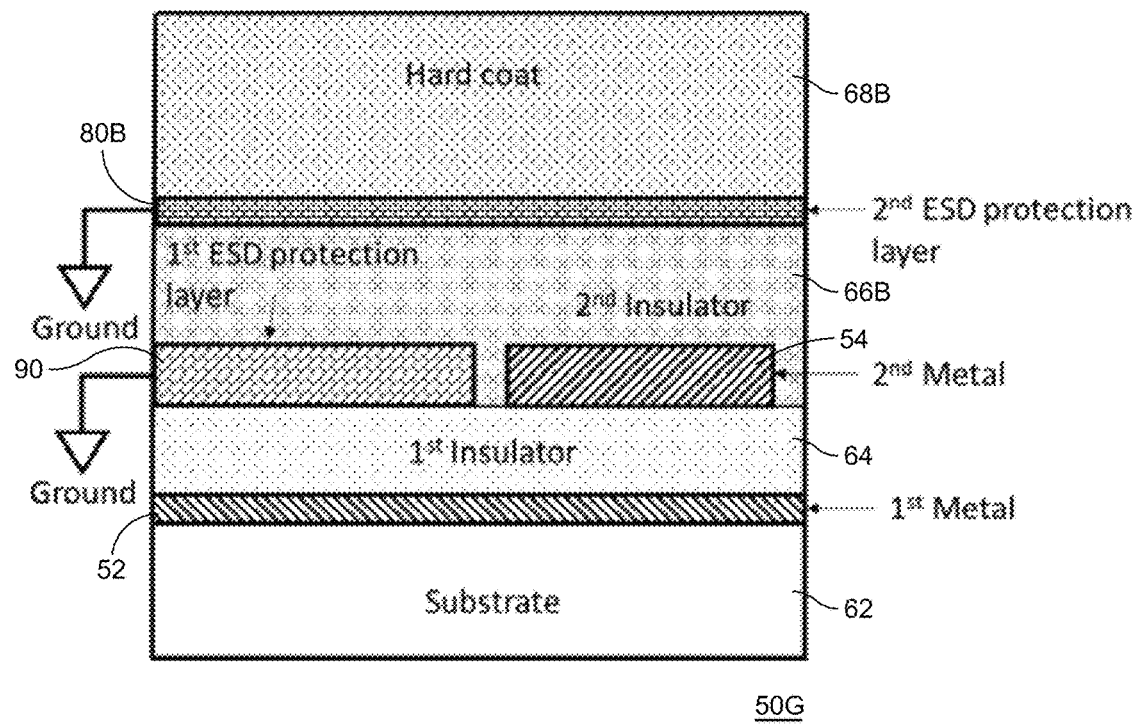
FIG. 15 illustrates an alternative embodiment of a pixel structure having two vertically separated ESD protection layers.
Figure 25:
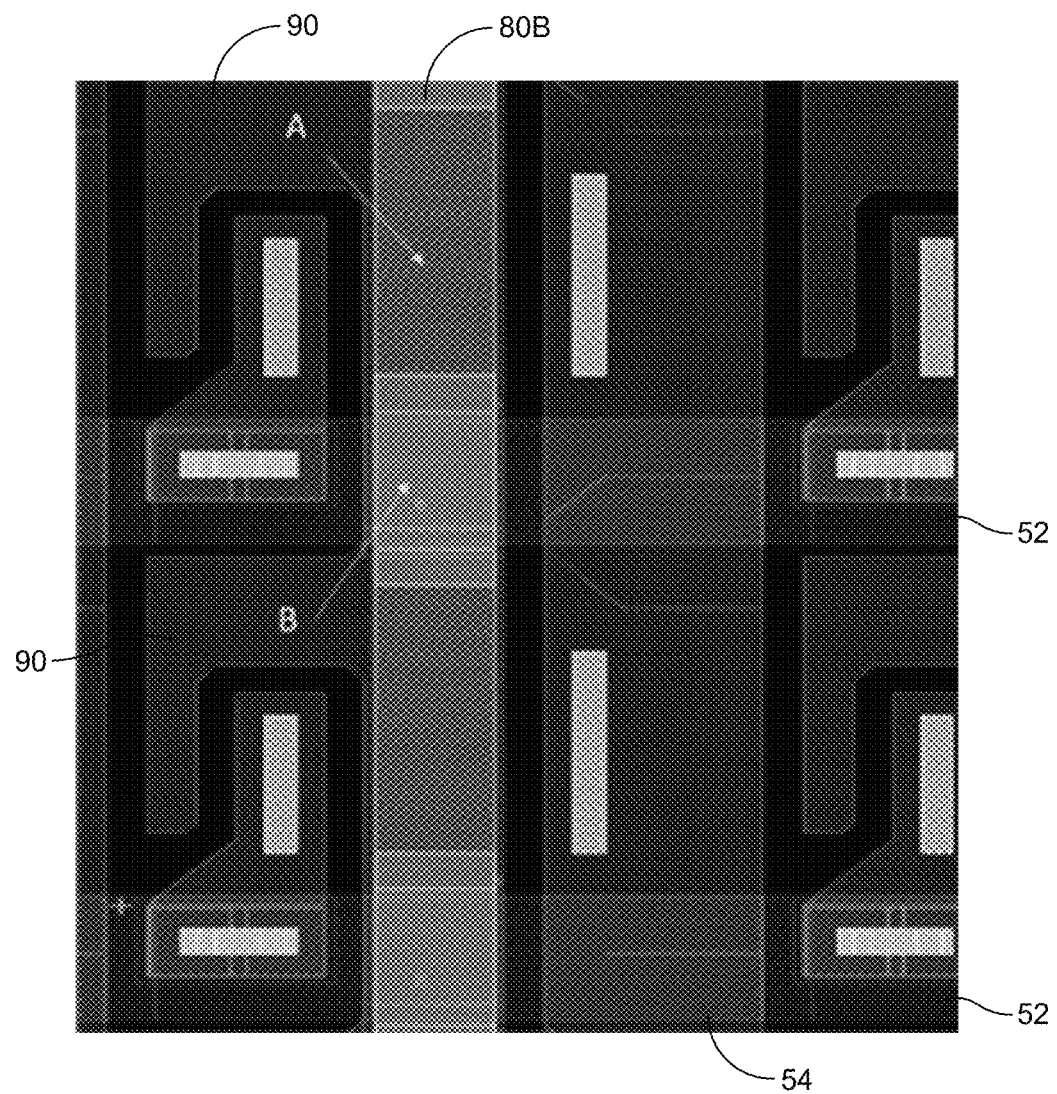
FIG. 25 shows a design layout of a third production example of a sensing device having an alternative configuration of conductive second ESD protection layer.

In another embodiment, the second ESD protection layer 80B may be grounded separately from the first ESD protection layer 90 as explained in connection with FIG. 15. The second ESD protection layer 80B may be patterned as stripes over the sensing element and electrically grounded outside of the active sensing pixel array. The second ESD protection layer may further comprise two areas that are disposed separately. For example, in FIG. 25, in embodiments the second ESD protection layer 80B may comprise a thicker 2000 Å-thick Mo layer in area A, and a thinner 1000 Å-thick Mo layer in area B. Alternatively, in embodiments the second ESD protection layer may comprise a thicker 2000 Å-thick Mo layer in area A, and a thinner 850 Å-thick ITO layer in area B. The main advantage of dividing the second ESD protection layer 80B into multiple segments is that the combination of materials can be carefully chosen to minimize mechanical stress, thus to optimize the adhesion between layers and to improve the long-term reliability. A second benefit is that the thickness of the materials can be refined to better planarize the topology of the sensor surface and thus to improve the scratch resistance.

4$^{th}$ Production Example

As discussed above, ESD charge is found to be attracted to ion implanted regions inside the pixel, i.e., N+ or P+ polysilicon regions of a PIN diode. Therefore, in embodiments a dummy ion implanted polysilicon region is placed within each pixel. An example layout is shown in FIGS. 26A and 26B. In addition to the sensing diode and addressing lines within each pixel, a dummy polysilicon island is formed in the empty area (FIG. 26A) followed by an N+ ion implantation (FIG. 26B). The N+ polysilicon island is connected to the first ESD protection layer through vias (FIG. 26C). As with embodiments with multiple layers of ESD protection, the first ESD protection layer is electrically grounded, and the second ESD protection layer can be added optionally for additional ESD protection. In this configuration, the N+ islands provide an additional electron-hole recombination reservoir to locally neutralize the ESD charge, which helps confine the ESD effect to a smaller area and thus reduces the overall sensor damage.

Figure 27:
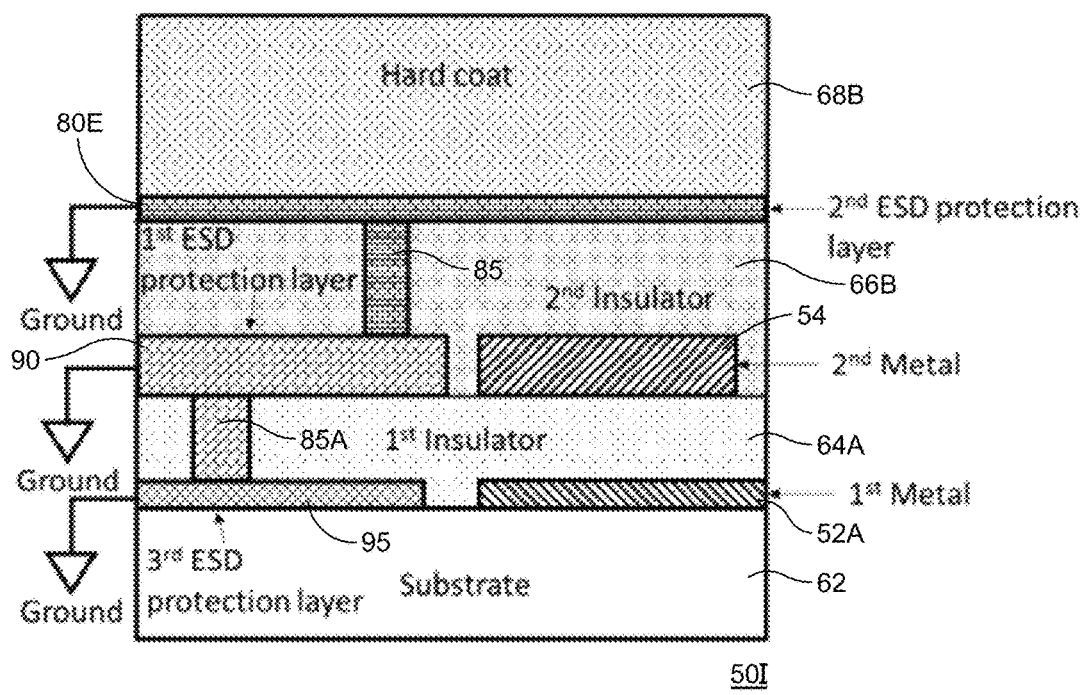
FIG. 27 illustrates an alternative embodiment of a pixel structure having three vertically separated ESD protection layers.

FIG. 27 illustrates an embodiment of pixel structure 50I having an ESD protection structure including three ESD protection layers, including a first ESD protection layer 90 (described above) disposed in the plane or level of the second metal layer 54, a second ESD protection layer 80E disposed over second insulating layer 66B, and a third ESD protection layer 95 disposed in the plane or level of the first metal layer 52A. The second ESD protection layer 80E may be electrically connected to the first and third ESD protection layer locally in each sensing pixel through vias 85 and 85A. In embodiments, all or some of the three ESD layers are grounded outside the active sensing area 501.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:
1. A fingerprint sensing device, comprising:
a substrate;

a plurality of pixels arranged in a grid of rows and columns, each pixel having an active thermal sensing element therein;

a first metal layer forming first addressing lines for addressing the active thermal sensing elements;

a second metal layer forming second addressing lines for addressing the active thermal sensing elements;

a first electrically conductive ESD protection layer;

a second electrically conductive ESD protection layer disposed at a layer above the first ESD protection layer; and an insulating layer disposed between the first and second ESD protection layers, wherein at least one of the first and second ESD protection layers is connected to a bias potential.

2. The device of claim 1, wherein at least one of the first and second ESD protection layers is disposed in a pattern such that it partially overlaps each pixel, the ESD protection layer at least partially overlapping the active thermal sensing element of each pixel.

3. The device of claim 1, wherein the active thermal sensing element is a PIN diode and wherein the at least one of the first and second ESD protection layers is disposed over the intrinsic region of the PIN diode.

4. The device of claim 1, wherein the first and second electrically conductive ESD protection layers are electrically connected through vias.

5. The device of claim 4, wherein the vias do not overlap with either the first or the second metal layers.

6. The device of claim 4, wherein the vias provide a low-impedance path from either the first or the second ESD protection layer to the bias potential.

7. The device claim 1, wherein at least one of the first and second electrically conductive ESD protection layers is arranged as an array of conductive stripes.

8. The device of claim 1, wherein the second electrically conductive ESD protection layer comprises conductive isolated islands formed over respective active thermal sensing elements.

9. The device of claim 1, wherein at least one of the first and the second electrically conductive ESD protection layers is arranged in a mesh pattern.

10. The device of claim 1, further comprising a hard coat layer disposed over the second electrically conductive ESD protection layer.

11. The device of claim 1, wherein the first electrically conductive ESD protection layer is formed in plane with the second metal layer.

12. The device of claim 1, wherein at least one the first and second electrically conductive ESD protection layers is arranged so as to allow the insulating layer to have a substantially planar upper surface on which a hard coat layer is disposed.

13. The device of claim 1, wherein each pixel includes an ion implanted recombination reservoir electrically isolated from the active thermal sensing element of the pixel and electrically connected to at least one of the electrically conductive ESD protection layers through a conductive via.

14. The device of claim 1, further comprises a third electrically conductive ESD protection layer, wherein the third electrically conductive ESD protection layer is disposed in plane with the first metal layer, wherein the first electrically conductive ESD protection layer is electrically connected to the third electrically conductive ESD protection layer and the third electrically conductive ESD protection layer is electrically connected to a bias potential.

15. The device of claim 1, wherein the substrate is flexible.

16. The device of claim 1, wherein the bias potential is ground.

17. A fingerprint sensing device, comprising:

a substrate;

a plurality of pixels arranged in a grid of rows and columns, each pixel having an active thermal sensing element therein;

a first metal layer forming first addressing lines for addressing the active thermal sensing elements;

a second metal layer above the first metal layer and forming second addressing lines for addressing the active thermal sensing elements;

an electrically conductive ESD protection layer; and an insulating layer disposed between the ESD protection layer and the active thermal sensing elements, wherein the ESD protection layer is electrically connected to a bias potential, wherein the ESD protection layer is disposed in a pattern such that it partially overlaps each pixel, the ESD protection layer at least partially overlapping the active thermal sensing element of each pixel.

18. The device of claim 17, wherein the active thermal sensing element is a PIN diode and the ESD protection layer is disposed over the intrinsic region of the PIN diode.

19. The device of claim 17, wherein the ESD protection layer is laterally spaced from the second addressing lines of the second metal layer.

20. The device of claim 17, wherein the ESD protection layer is arranged in a mesh pattern.

21. The device of claim 17, wherein the ESD protection layer is arranged as an array of conductive stripes.

22. The device of claim 17, wherein the insulating layer and ESD protection layer are arranged to provide a substantially planar upper surface on which a hard coat layer is disposed.

23. The device of claim 17, further comprising a pad that is connected to an external bias potential, wherein the ESD protection layer is connected to the pad.

24. The device of claim 17, further comprises a conductive bezel, wherein the ESD protection layer is connected to the bezel and the bezel is connected to the bias potential.

25. The device of claim 17, wherein each pixel includes an ion implanted recombination reservoir electrically isolated from the active thermal sensing element of the pixel and electrically connected to the ESD protection layer through a conductive via.

26. The device of claim 17, wherein the substrate is flexible.

27. The device of claim 17, wherein the bias potential is ground.

28. The device of claim 17, further comprising a hard coat layer disposed over the ESD protection layer.

29. The device of claim 17, further comprising a second electrically conductive ESD protection layer vertically spaced from the electrically conductive ESD protection layer, and an insulating layer in between the electrically conductive ESD layers.

30. The device of claim 29, wherein one of the electrically conductive ESD protection layers is disposed in plane with the second metal layer.

31. The device of claim 29, wherein the electrically conductive ESD protection layers are electrically connected to each other through conductive vias.

32. The device of claim 29, wherein the second electrically conductive ESD protection layer is electrically connected to the bias potential.

\* \* \* \* \*